US007416611B2

(12) United States Patent
Bergman

(10) Patent No.: US 7,416,611 B2
(45) Date of Patent: *Aug. 26, 2008

(54) PROCESS AND APPARATUS FOR TREATING A WORKPIECE WITH GASES

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/870,173

(22) Filed: Jun. 18, 2004

(65) Prior Publication Data

US 2004/0221877 A1 Nov. 11, 2004

Related U.S. Application Data

(63) Continuation-in-part of application No. 09/925,884, filed on Aug. 6, 2001, which is a continuation-in-part of application No. 09/621,028, filed on Jul. 21, 2000, now Pat. No. 6,869,487, and a continuation-in-part of application No. PCT/US99/08516, filed on Apr. 16, 1999, which is a continuation-in-part of application No. 08/853,649, filed on May 9, 1997, now Pat. No. 6,240,933, and a continuation-in-part of application No. 09/061,318, filed on Apr. 16, 1998, now abandoned.

(60) Provisional application No. 60/486,771, filed on Jul. 10, 2003, provisional application No. 60/145,350, filed on Jul. 23, 1999, provisional application No. 60/125,304, filed on Mar. 19, 1999, provisional application No. 60/099,067, filed on Sep. 3, 1998.

(51) Int. Cl.
B08B 3/00 (2006.01)

(52) U.S. Cl. .............................. 134/30; 134/1; 134/1.3; 134/2; 134/3; 134/19; 134/25.4; 134/26; 134/31; 134/33; 134/34; 134/41; 134/902

(58) Field of Classification Search ..................... 134/1, 134/1.3, 2, 3, 19, 25.4, 26, 30, 31, 33, 41, 134/902, 34
See application file for complete search history.

(56) References Cited

U.S. PATENT DOCUMENTS 4,064,885 A 12/1977 Dussault et al.
4,186,032 A 1/1980 Ham (Continued)

FOREIGN PATENT DOCUMENTS

DE 19801360 A1 7/1999
EP 0 344 764 12/1989

(Continued)

OTHER PUBLICATIONS

Alder, M., et al., "The Kinetics and Mechanism of Hydroxide Ion Catalyzed Ozone Decomposition in Aqueous Solution." *J. Am Chem. Soc.*, 72:1884-1886 (1950).

(Continued)

*Primary Examiner*—Michael Barr
*Assistant Examiner*—Rita R Patel
(74) *Attorney, Agent, or Firm*—Perkins Coie

(57) ABSTRACT

In a method and apparatus for cleaning or processing a workpiece, a process gas is brought into contact with the workpiece by diffusion through a heated liquid layer on the workpiece, and by bulk transport achieved by entraining the gas in a liquid stream, spray or jet impinging on the workpiece. The process gas, which may be ozone, is entrained in the liquid via entrainment nozzles. Use of entrainment and diffusion together increases the amount of gas available for reaction at the workpiece surface, increases the reaction rate, and decreases required process times.

24 Claims, 14 Drawing Sheets

U.S. PATENT DOCUMENTS

| | | | |
|---|---|---|---|
| 4,633,804 A | 1/1987 | Arii | |
| 4,695,327 A | 9/1987 | Grebinski | |
| 4,749,440 A | 6/1988 | Blackwood et al. | |
| 4,778,532 A | 10/1988 | McConnell et al. | |
| 4,817,652 A | 4/1989 | Liu et al. | |
| 4,899,767 A | 2/1990 | McConnell et al. | |
| 4,917,123 A | 4/1990 | McConnell et al. | |
| 4,974,530 A | 12/1990 | Lyon | |
| 5,032,218 A | 7/1991 | Dobson | |
| 5,039,349 A | 8/1991 | Schoeppel | |
| 5,055,138 A | 10/1991 | Slinn | |
| 5,063,609 A | 11/1991 | Lorimer | |
| 5,071,485 A | 12/1991 | Matthews et al. | |
| 5,105,556 A | 4/1992 | Kurokawa et al. | |
| 5,147,499 A | 9/1992 | Szwejkowski et al. | |
| 5,160,378 A | 11/1992 | Tuunanen et al. | |
| 5,120,370 A | 1/1993 | Mori et al. | |
| 5,181,985 A | 1/1993 | Lampert et al. | |
| 5,232,511 A * | 8/1993 | Bergman | 134/2 |
| 5,232,870 A | 8/1993 | Ito et al. | |
| 5,234,540 A | 8/1993 | Grant et al. | |
| 5,235,995 A | 8/1993 | Bergman et al. | |
| 5,244,000 A | 9/1993 | Stanford et al. | |
| 5,246,526 A | 9/1993 | Yamaguchi et al. | |
| 5,248,380 A | 9/1993 | Tanaka | |
| 5,308,745 A | 5/1994 | Schwartzkopf | |
| 5,326,406 A | 7/1994 | Kaneko et al. | |
| 5,366,757 A | 11/1994 | Lin | |
| 5,372,651 A | 12/1994 | Kodama | |
| 5,378,317 A | 1/1995 | Kashiwase et al. | |
| 5,415,191 A | 5/1995 | Mashimo et al. | |
| 5,423,944 A | 6/1995 | Wong | |
| 5,447,640 A | 9/1995 | Omi | |
| 5,464,480 A | 11/1995 | Matthews | |
| 5,503,708 A | 4/1996 | Koizumi et al. | |
| 5,518,542 A | 5/1996 | Matsukawa et al. | |
| 5,520,744 A | 5/1996 | Fujikawa et al. | |
| 5,569,330 A * | 10/1996 | Schild et al. | 134/1 |
| 5,571,367 A | 11/1996 | Nakajima et al. | |
| 5,626,769 A | 5/1997 | Sawamoto | |
| 5,632,847 A | 5/1997 | Ohno et al. | |
| 5,647,386 A | 7/1997 | Kaiser | |
| 5,658,615 A | 8/1997 | Hasebe et al. | |
| 5,705,089 A | 1/1998 | Sugihara et al. | |
| 5,714,203 A | 2/1998 | Schellenberger et al. | |
| 5,730,806 A | 3/1998 | Caimi et al. | |
| 5,749,975 A | 5/1998 | Li | |
| 5,759,971 A | 6/1998 | Manako | |
| 5,762,755 A | 6/1998 | McNeilly et al. | |
| 5,776,296 A | 7/1998 | Matthews | |
| 5,803,982 A | 9/1998 | Kosofsky et al. | |
| 5,810,940 A | 9/1998 | Fukazawa | |
| 5,832,177 A | 11/1998 | Shingawa et al. | |
| 5,845,662 A | 12/1998 | Sumnitsch | |
| 5,858,107 A | 1/1999 | Chao et al. | |
| 5,868,866 A | 2/1999 | Maekawa et al. | |
| 5,896,875 A | 4/1999 | Yoneda | |
| 5,911,836 A | 6/1999 | Hada et al. | |
| 5,911,837 A | 6/1999 | Matthews | |
| 5,916,366 A | 6/1999 | Ueyama et al. | |
| 5,922,624 A | 7/1999 | Verhaverbeke et al. | |
| 5,927,306 A | 7/1999 | Izumi et al. | |
| 5,944,907 A | 8/1999 | Ohmi | |
| 5,950,643 A | 9/1999 | Miyazaki et al. | |
| 5,964,952 A | 10/1999 | Kunze-Concewitz | |
| 5,964,954 A | 10/1999 | Matsukawa et al. | |
| 5,971,368 A | 10/1999 | Nelson et al. | |
| 5,975,098 A | 11/1999 | Yoahitani et al. | |
| 5,990,060 A | 11/1999 | Ohmi et al. | |
| 6,003,527 A | 12/1999 | Netsu et al. | |
| 6,030,932 A | 2/2000 | Leon | |
| 6,085,764 A | 7/2000 | Kobayashi | |
| 6,146,469 A | 11/2000 | Toshima | |
| 6,162,734 A | 12/2000 | Bergman et al. | |
| 6,199,567 B1 | 3/2001 | Kanno et al. | |
| 6,202,658 B1 | 3/2001 | Fishkin et al. | |
| 6,235,112 B1 | 5/2001 | Satoh | |
| 6,240,933 B1 | 6/2001 | Bergman | |
| 6,267,125 B1 | 7/2001 | Bergman et al. | |
| 6,273,108 B1 | 8/2001 | Bergman et al. | |
| 6,295,999 B1 | 10/2001 | Bran | |
| 6,299,696 B2 | 10/2001 | Kamikawa et al. | |
| 6,325,081 B1 | 12/2001 | Miki et al. | |
| 6,406,551 B1 * | 6/2002 | Nelson et al. | 134/3 |
| 6,423,146 B1 | 7/2002 | Fukazawa | |
| 6,431,184 B1 | 8/2002 | Taniyama | |
| 6,455,717 B1 | 9/2002 | Vaartstra | |
| 6,497,768 B2 | 12/2002 | Bergman | |
| 6,543,080 B1 | 4/2003 | Tomita et al. | |
| 6,551,409 B1 | 4/2003 | DeGendt et al. | |
| 6,582,525 B2 | 6/2003 | Bergman | |
| 6,626,189 B2 | 9/2003 | Kashkoush et al. | |
| 6,701,941 B1 * | 3/2004 | Bergman et al. | 134/25.4 |
| 6,743,301 B2 | 6/2004 | Matsuno et al. | |
| 6,758,938 B1 | 7/2004 | Torek | |
| 6,806,205 B2 | 10/2004 | Jang et al. | |
| 6,817,370 B2 * | 11/2004 | Bergman et al. | 134/105 |
| 6,843,857 B2 * | 1/2005 | Bergman | 134/28 |
| 6,869,487 B1 | 3/2005 | Bergman | |
| 6,982,006 B1 | 1/2006 | Boyers et al. | |
| 2002/0011257 A1 | 1/2002 | DeGendt et al. | |
| 2002/0066464 A1 | 6/2002 | Bergman | |
| 2004/0154641 A1 * | 8/2004 | Montierth | 134/3 |
| 2005/0034745 A1 * | 2/2005 | Bergman et al. | 134/26 |
| 2006/0137723 A1 * | 6/2006 | Bergman | 134/34 |

FOREIGN PATENT DOCUMENTS

| | | |
|---|---|---|
| EP | 0 548 596 A2 | 6/1993 |
| EP | 0 587 889 | 3/1994 |
| EP | 0 702 399 | 3/1996 |
| EP | 0 782 177 A2 | 7/1997 |
| EP | 0 890 658 | 1/1999 |
| GB | 2 287 827 | 9/1995 |
| JP | 52-12063 | 4/1977 |
| JP | 52-100473 | 8/1977 |
| JP | 54-034751 | 3/1979 |
| JP | 59-068930 | 4/1984 |
| JP | S61-004232 | 1/1986 |
| JP | 62-117330 | 5/1987 |
| JP | 63-110732 | 5/1987 |
| JP | 63-016127 | 1/1988 |
| JP | 64-008630 | 1/1989 |
| JP | 64-042129 | 2/1989 |
| JP | 01-189921 | 7/1989 |
| JP | 01-192712 | 8/1989 |
| JP | H01-262627 | 10/1989 |
| JP | 03-041729 | 2/1991 |
| JP | 03-072626 | 3/1991 |
| JP | H03-208900 | 9/1991 |
| JP | 04-079221 | 3/1992 |
| JP | H04-125927 | 4/1992 |
| JP | 04-164324 | 6/1992 |
| JP | 04-302144 | 10/1992 |
| JP | 04-302145 | 10/1992 |
| JP | H04-298038 | 10/1992 |
| JP | 04-370931 | 12/1992 |
| JP | 05-013398 | 1/1993 |
| JP | 05-109686 | 4/1993 |
| JP | 05-136045 | 6/1993 |
| JP | 05-259139 | 10/1993 |
| JP | 05-283389 | 10/1993 |
| JP | 06-204130 | 7/1994 |
| JP | 07-155714 | 6/1995 |

| | | |
|---|---|---|
| JP | 07-159980 | 6/1995 |
| JP | 08-008222 | 1/1996 |
| JP | 08-064566 | 3/1996 |
| JP | 08-160032 | 6/1996 |
| JP | 08-288271 | 11/1996 |
| JP | 09-139345 | 5/1997 |
| JP | 10-144640 | 5/1998 |
| JP | 11-054227 | 2/1999 |
| JP | 2000-138188 | 5/2000 |
| WO | WO 99/52654 | 10/1999 |
| WO | WO 01/07177 A1 | 2/2001 |

OTHER PUBLICATIONS

Amick, J.A., "Cleanliness and the Cleaning of Silicon Wafers." *Solid State Technology*, pp. 47-52 (Nov. 1976).
Anantharaman, et al., "Organics: Detection and Characterization of Organics in Semiconductor DI Water Processes." *Ultrapure Water*, pp. 30-36 (Apr. 1994).
Baumgärtner, H., et al., "Ozone Cleaning of the Si-SiO$_2$ System." *Appl. Phys. A*, 43:223-226 (1987).
Bedge, S., et al., "Kinetics of UV/O$_2$ Cleaning and Surface Passivation: Experiments and Modeling." *Mat. Res. Soc. Symp. Proc.*, 259:207-212 (1992).
Bolon, D.A., et al., "Ultraviolet Depolymerization of Photoresist Polymers, " *Polymer Engineering and Science*, 12(2):108-111 (Mar. 1972).
Christenson, K., et al., "Deionized Water Helps Remove Wafer Stripping 'Resist'- ance." www.precisioncleaningweb.com—*Precision Cleaning Web—Archives*, pp. 10-20 (Apr. 1998).
Egitto, F.D., et al., "Removal of Poly (Dimethylsiloxane) Contamination From Silicon Surfaces With UV/Ozone Treatment." *Mat. Res. Soc. Symp. Proc.*, 385:245-250 (1995).
Gabriel, C., et al., "Reduced Device Damage Using An Ozone Based Photoresist Removal Process." *SPIE Advances in Resist Technology and Processing VI*, 1086:598-604 (1989).
Ganesan, G., et al., "Characterizing Organic Contamination in IC Package Assembly." *The Int'l. Soc. for Hybrid Microelectronics*, 17(2), Second Quarter, 152-160 (1994).
Golland, D.E., et al., "The Clean Module: Advanced Technology for Processing Silicon Wafers." *Semiconductor Int'l.*, pp. 154-157 (Sep. 1987).
Goulding, M.R., "The selective epitaxial growth of silicon," *Materials Science and Engineering*, vol. B17, pp. 47-67 (1993).
Heyns, M.M., et al., "New Wet Cleaning Strategies for Obtaining Highly Reliable Thin Oxides." *MRP Symposium Proceedings on Materials Research Society*, Spring Meeting, San Francisco, CA, Apr. 12-13, p. 35 (1993).
Huynh, C., et al., "Plasma versus ozone photoresist ashing: Temperature effects on process-induced mobile ion contamination." *J. Vac. Sci. Technol.*, B9(2):353-356 (Mar./Apr. 1991).
Isagawa, T., et al., "Ultra Clean Surface Preparation Using Ozonized Ultrapure Water." *Extended Abstracts of the 1992 Int'l. Conf. on Solid State Devices and Materials*, pp. 193-195 (1992).
Kasi, S., et al., "Surface Hydrocarbon Removal from Si by UV/Ozone." *ECS Extended Abstracts*, No. 458, pp. 691-692 (1990).
Kasi, S., et al., "Vapor phase hydrocarbon removal for Si processing." *Appl. Phys. Lett.*, 57(20):2095-2097 (Nov. 1990).
Kern, W., "The Evolution of Silicon Wafer Cleaning Technology." *J. Electrochem. Soc.*, 137(6):1887-1892 (Jun. 1990).
Krusell, W.C., et al., "Cleaning Technologies for High Volume Production of Silicon Wafers." *ECS Proc. of the First Int'l. Symposium on Cleaning Technology in Semiconductor Device Mfg.*, pp. 23-32 (Oct. 1989).
Krusell, W.C., et al., "The Characterization of Silicon Substrate Cleaning Treatments by use of SIMS and MOS Electrical Testing." *ECS Extended Abstracts*, No. 229, p. 331-332 (1986).
Nelson, S., "Ozonated water for photoresist removal." *Solid State Technology*, p. 107-112 (Jul. 1999).
Ohmi, T., et al., "Native Oxide Growth and Organic Impurity Removable on Si Surface with Ozone-Injected Ultrapure Water." *J. Electrochem. Soc.*, 140(3):804-810 (Mar. 1993).
Sehested, K., et al., "Decomposition of Ozone in Aqueous Acetic Acid Solutions (pH 0-4)." *Phys. Chem.*, pp. 1005-1009 (1992).
Shimada, H., et al., "Residual-Surfactant-Free Photoresist Development Process." *J. Electrochem., Soc.*, 139(6):1721-1730 (Jun. 1992).
Suemitsu, M., et al., "Low Temperature Silicon Surface Cleaning by HF Etching/Ultraviolet Ozone Cleaning (HF/UVOC) Method (I)- Optimization of the HF Treatment." *Japanese Journal of Applied Physics*, 28(12):2421-2424 (Dec. 1989).
Tabe, M., "UV ozone cleaning of silicon substrates in silicon molecular beam epitaxy." *Appl. Phys. Lett.*, 45(10):1073-1075 (Nov. 1984).
Tong, J., et al., "Aqueous Ozone Cleaning of Silicon Wafers." *ECS Extended Abstracts*, Phoenix, AZ, Abstract No. 506, pp. 753 (Oct. 13-17, 1991).
Tong, J., et al., "Aqueous Ozone Cleaning of Silicon Wafers." *Proc. of 2.sup.nd Int'l. Symposium on Cleaning Tech. In Semiconductor Device Mfg.*, pp. 18-25 (Oct. 1992).
Vig, J., "UV/Ozone Cleaning of Surfaces." *U.S. Army Elec. Tech. and Devices Lab.*, pp. 1-26.
Vig, J., "UV/Ozone Cleaning of Surfaces: A Review." *Surface Contamination: Genesis, Detection, and Control*, pp. 235-253 (1979).
Vig, J., et al., "UV/Ozone Cleaning of Surfaces." *IEEE Transactions on Parts, Hybrids, and Packaging*, vol. PHP-12(4):365-370 (Dec. 1976).
Vig, J., "UV/Ozone Cleaning of Surfaces." *U.S. Army Electronics Technology and Devices Laboratory*, ERADCOM, Ft. Monmouth, NJ, 07703-5302, pp. 1027-1034 (Sep./Oct. 1984).
Zafonte, L., et al., "UV/Ozone Cleaning For Organics Removal on Silicon Wafers." *SPIE Optical Microlithography III: Technology for the Next Decade*, 470:164-175 (1984).
Zazzera, L.A., et al., "XPS and SIMS Study of Anhydrous HF and UV/Ozone-Modified Silicon (100) Surfaces." *J. Electrochem. Soc.*, 136(2):484-491 (Feb. 1989).
"Ozone Concentration Measurement in a Process Gas." *Proposed IOA Pan American Group Guideline*, pp. 1-21 (Dec. 1993).
"Ozone for Semiconductor Applications." *Sorbios*, pp. 1-6 (Oct. 1991).
Bergman, E. et al., "HF-Ozone Cleaning Chemistry," Solid State Technology 46(7):115-124(2001).

* cited by examiner

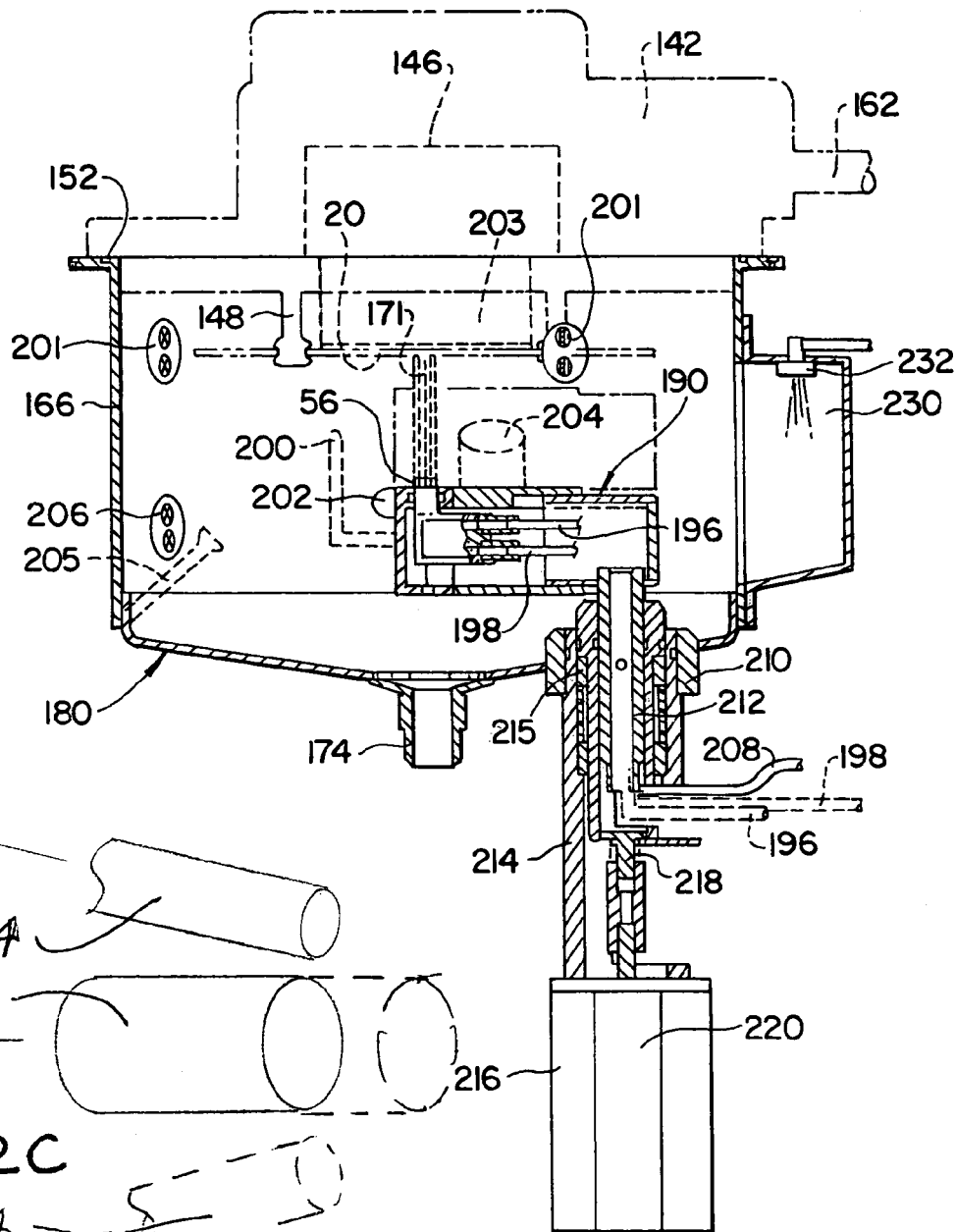

PROCESS AND APPARATUS FOR TREATING A WORKPIECE WITH GASES

BACKGROUND OF THE INVENTION

This application is a Continuation-in-Part of U.S. patent application Ser. No. 09/925,884, filed Aug. 6, 2001; which is a Continuation-in-Part of U.S. patent application Ser. No. 09/621,028, filed Jul. 21, 2000, and now U.S. Pat. No. 6,869,487; which:
- A.] is a Continuation-in-Part of U.S. patent application Ser. No. 08/853,649, filed May 9, 1997, now U.S. Pat. No. 6,240,933;
- B.] is a Continuation-in-Part of U.S. patent application Ser. No. 09/061,318, filed Apr. 16, 1998, now abandoned,
- C.] is a Continuation-in-Part of International Application No. PCT/US99/08516, filed Apr. 16, 1999, claiming priority to U.S. Provisional Patent Application Ser. No. 60/099,067, filed Sep. 3, 1998 and 60/125,304, filed Mar. 19, 1999; and
- D.] claims priority to U.S. Provisional Patent Application Ser. No. 60/145,350, filed Jul. 23, 1999.

This Application also claims priority to U.S. Provisional Patent Application Ser. No. 60/486,771, filed Jul. 10, 2003. Priority to each of these applications is claimed. The applications listed above are incorporated herein by reference.

Semiconductor devices are widely used in almost all consumer and home electronic products, as well as in communications, medical, industrial, military, and office products and equipment. Microelectronic semiconductor devices are manufactured from semiconductor wafers. The features forming these devices are often just fractions of a micron. This makes these microelectronic devices highly susceptible to performance degradation or even complete failure due to contamination by organic or metal particles. Consequently, cleaning the wafers, to remove contamination, is often a critical step in the manufacturing process.

For many years, wafers were cleaned in typically three or four separate steps using strong acids, such as sulfuric acid, and using strong caustic solutions, such as mixtures of hydrogen peroxide or ammonium hydroxide. Organic solvents have also been used with wafers having metal films. While these methods performed well, they had certain disadvantages, including the high cost of the process chemicals, the relatively long time required to get wafers through the various cleaning steps, high consumption of water due to the need for extensive rinsing between chemical steps, and high disposal costs. As a result, extensive research and development efforts focused on finding better wafer cleaning techniques.

More recently, the semiconductor manufacturing industry began to acknowledge a revolutionary new process for cleaning wafers, using ozone diffused through a thin layer of heated water on the wafers. This ozone diffusion process has proven itself to be highly effective in cleaning contamination and organic films off of wafers, while avoiding many of the disadvantages of the older methods using acids and caustics. The advantages of the ozone diffusion process are that is it fast, requires no expensive and toxic liquid acids or caustics, and operates effectively as a spray process, which greatly reduces water consumption and space requirements.

The ozone diffusion cleaning technique can be performed in various ways. These include spraying water onto the workpiece while injecting ozone into the water, spraying water on the workpiece while delivering ozone to the workpiece, delivering a combination of steam or water vapor and ozone to the workpiece, and applying water, ozone, and sonic energy simultaneously to the workpiece. Spray techniques using water at elevated temperatures have been especially successful at increasing the removal rates of various organic films and contaminants from workpiece surfaces.

SUMMARY OF THE INVENTION

A workpiece is cleaned or processed via a gas, such as ozone, which chemically reacts with contaminants on the workpiece surface. The gas is brought into contact with the workpiece surface via bulk transport, by entraining the gas into a stream, spray or jet of liquid directed at the wafer surface. A layer of liquid is advantageously formed on the wafer surface. Gas introduced into the chamber or space around the workpiece diffuses through the layer of liquid and chemically reacts with contaminants on the workpiece surface. Use of entrainment and diffusion together increases the amount of gas available for reaction at the workpiece surface, increases the reaction rate, and decreases required process times. With this method, the amount of gas needed for processing is also reduced.

Ozone (or other process gas) may be entrained in the liquid by injecting the ozone into the liquid, and then subsequently spraying the liquid out of a spray nozzle. Alternatively, entrainment may be achieved by introducing ozone into the liquid after the liquid emerges from a spray nozzle, or other outlet. Nozzles using sonic energy may be used. The liquid is advantageously heated, to accelerate the cleaning or processing chemical or oxidizing reactions. The liquid in many applications is water, and may optionally include one or more chemical additives. The workpiece may be rotated during processing, to help uniformly distribute the liquid across the workpiece surface, to maintain a liquid layer of desired thickness on the workpiece surface, and/or to maintain a flow of fresh liquid on the workpiece surface. Steam may be used with the liquid, or in place of the liquid.

In an apparatus for processing or cleaning one or more workpieces, a fixture or a rotor holds workpieces in a chamber. One or more nozzles or outlets in the chamber is directed towards the fixture or rotor. A process gas is entrained into a flow of heated liquid via an entrainment nozzle. A process gas source also preferably provides process gas into the chamber where the gas moves into contact with the workpiece via diffusion.

In another aspect, an apparatus for removing contaminants from a workpiece includes at least one jet nozzle directed towards the workpiece. The jet nozzle and the workpiece are movable relative to each other. A source of high-pressure liquid is connected to the jet nozzle. A fast-moving, high-pressure jet or column of liquid from the nozzle moves over substantially all of the workpiece surface facing the nozzle, as the nozzle and/or workpiece move relative to each other. The nozzle may advantageously be supported on a swing arm which pivots relative to the fixture. The nozzle may be above or below, or to one side of the workpiece so that the jet travels vertically up or down, or horizontally. A heater heats the liquid used to form the jet. Ozone is supplied into the chamber and diffuses through the boundary layer, to remove contaminants. Ozone is also provided more directly to the workpiece via bulk transport, via ozone jets, nozzles or outlets adjacent to the workpiece, or to the liquid jet nozzle. A concentric opening nozzle may be used to deliver ozone within a column or jet of heated liquid, or vice versa.

It is an object of the invention to provide improved cleaning or processing methods and apparatus. The invention resides as well as subcombinations of the features, components, steps and subsystems shown and described. The optional features described in one embodiment or shown in one drawing figure may equally as well be used in any other embodiment.

BRIEF DESCRIPTION OF THE DRAWINGS

FIG. 4 also shows entrainment of a process gas into liquid or steam sprayed or jetted onto the workpiece.

FIG. 12A is a section view of an alternative process chamber for use in such apparatus. FIGS. 12B and 12C are schematic perspective views of jet nozzles for use in the systems shown in FIGS. 7, 8 or 12A.

Figure 1:
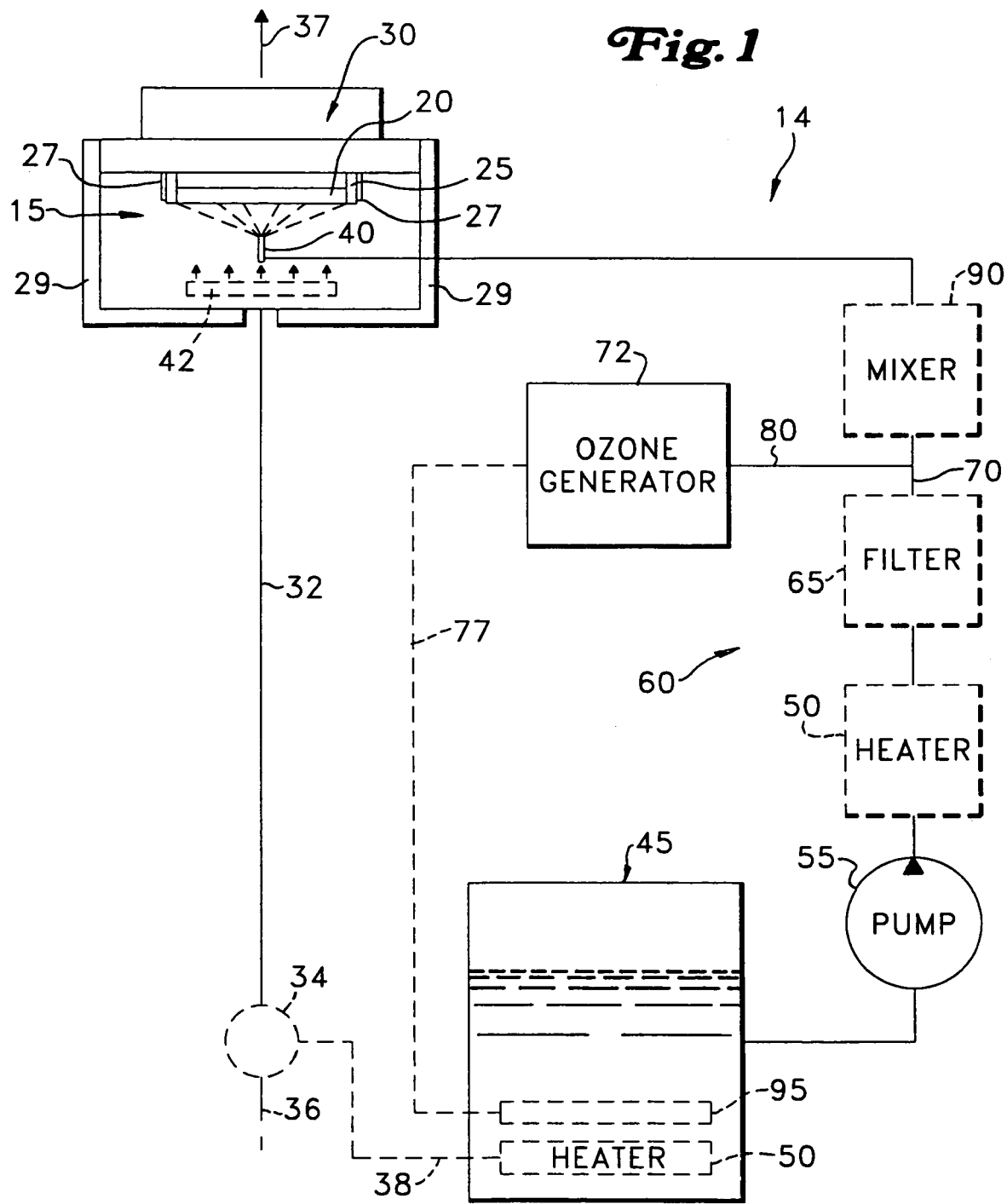
FIG. 1 is a schematic block diagram of an apparatus for cleaning or processing a workpiece, such as a semiconductor wafer, with ozone injected or bubbled into the liquid.

The drawings listed above are intended to conceptually show the design and operation of aspects of the inventions. The positions and connections between the elements or components may of course be made in various ways, with the drawings showing such elements and connections schematically, and not necessarily physically or mechanically. Dotted or dashed lines in the drawings indicate optional and non-essential elements or connections. The drawings include elements and/or examples of process liquids and gases, and process steps, to illustrate various advantageous features. However, the presence of such features, elements, steps or a specific process liquid or gas in the drawings, does not mean that it is essential to the invention.

DETAILED DESCRIPTION OF THE INVENTION

A workpiece is defined here to include any object formed from a substrate upon which microelectronic circuits or components, data storage elements or layers, and/or micro-mechanical or micro-electromechanical elements are or can be formed. The apparatus and methods described here may be used to clean or process workpieces such as semiconductor wafers, silicon wafers, as well as other workpieces such as flat panel displays, hard disk media, CD glass, memory media, MEMs devices, etc., all collectively referred to here as a workpiece.

Figure 14:
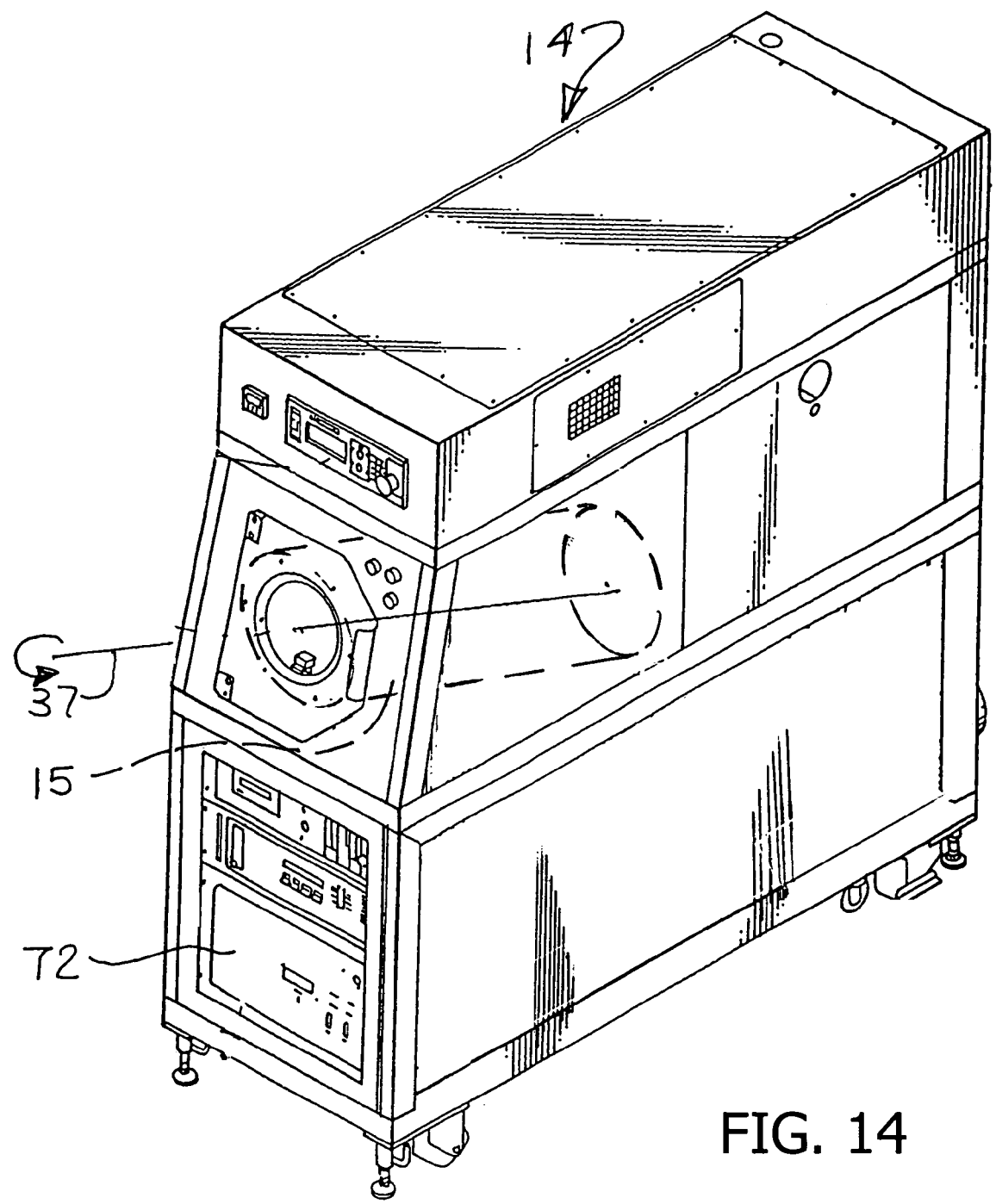
FIG. 14 is a perspective view of a system for processing workpieces as described in connection with FIGS. 1-6.
Figure 15:
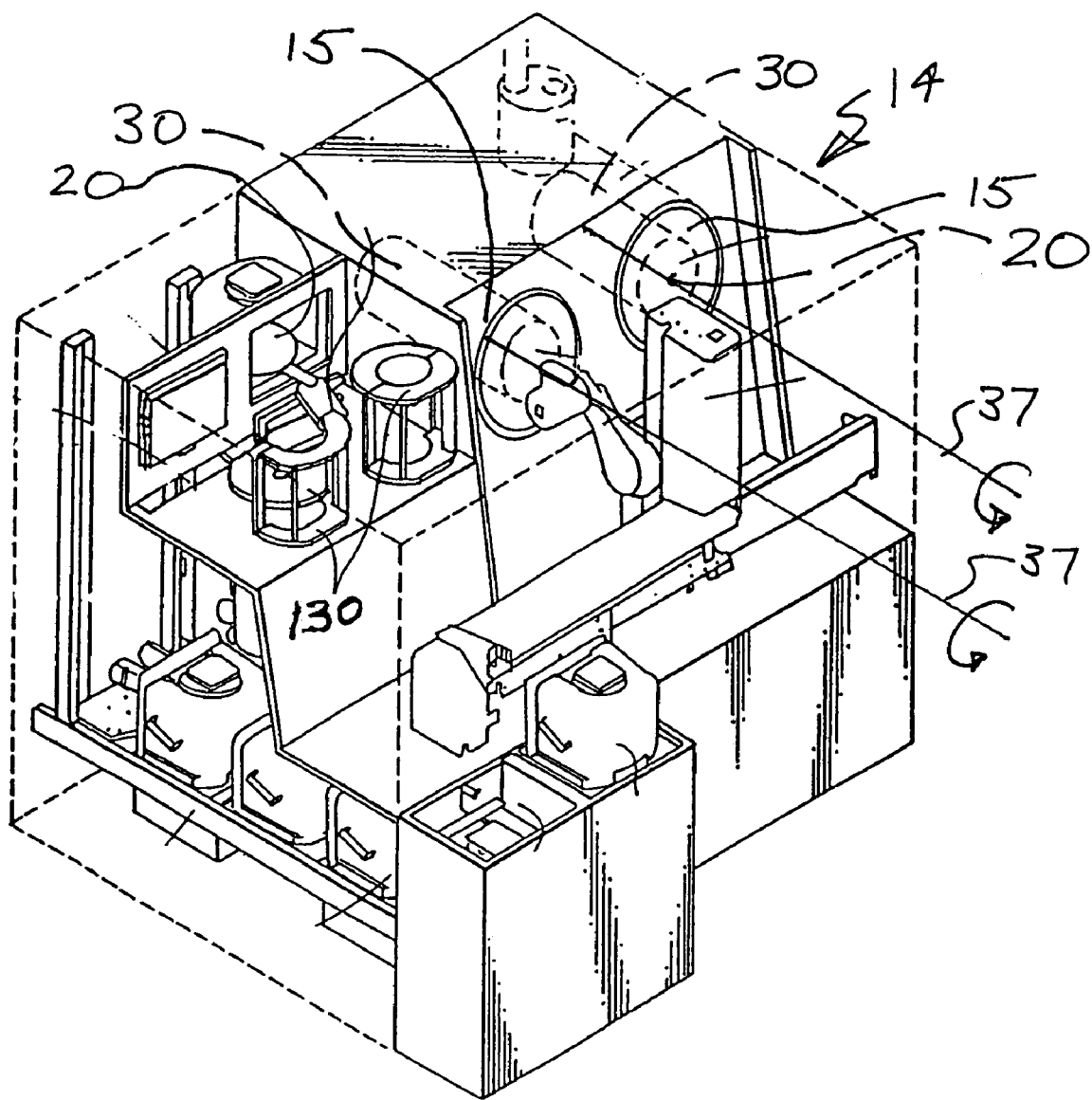
FIG. 15 is a cutaway perspective view of another system for processing workpieces as described in connection with FIGS. 1-6.

Although the systems in FIGS. 1-6 are generally illustrated as single wafer systems, these systems and methods may also be used on a batch processing of workpieces, for example as shown in FIGS. 14 and 15. Turning now to FIG. 1, in a processing or cleaning system 14, a workpiece 20 is preferably supported within a process chamber 15 by a workpiece holder, for example, a rotor assembly 30 having multiple supports 25. The rotor assembly 30 in FIG. 1 closes off the chamber. In contrast, the chambers in FIGS. 14 and 15 have a door that closes off and may also seal the chamber 15. The rotor assembly 30 in FIG. 1 may also optionally seal with the chamber 15 to form a sealed processing environment, although a sealed chamber or environment is not required. The process chamber, in its most basic form, need only provide an enclosure around the workpieces, to minimally confine and contain process liquids and/or gases. The rotor assembly 30 spins the workpiece 20 about a spin axis 37 during or after processing with a process gas and a process liquid. The rotor assembly may support the workpiece from above, as shown in FIG. 1, or from below, or in another orientation. Correspondingly, the spin axis 37, can be vertical, horizontal, or at an in-between orientation, either face up or face down. The rotor assembly can be any component provided to hold and spin the workpieces, directly or indirectly.

The volume of the chamber 15 is preferably minimized to be as small as permitted by design considerations for any given capacity (i.e., the number and size of the workpieces to be processed). The chamber 15 is preferably cylindrical for processing multiple wafers in a batch. A flatter disk-shaped chamber is advantageously used for single wafer processing. Typically, the chamber volume will range from about 5 liters, (for a single wafer) to about 50 liters (for a 50 wafer system).

One or more spray nozzles 40 within the process chamber 15 direct a spray mixture of ozone and liquid onto the surfaces of the workpiece 20. The nozzles 40 preferably direct a spray of liquid to the underside of the workpiece 20. However, the spray may be directed alternatively, or in addition, to the upper surface of the workpiece 20. The liquid may also be applied in other ways besides spraying, such as flowing, bulk deposition, immersion, condensation, etc, without the use of nozzles. The workpieces 20 may also be processed while in a vertical or near vertical orientation, as shown in FIGS. 14 and 15, as in general, gravitational forces are dominated by other forces, such as centrifugal forces, surface tension, etc.

The process liquid and ozone may be supplied to the nozzles 40 by a single fluid line carrying ozone mixed with the liquid, or multiple lines can be used. A reservoir 45 or tank holds the liquid. The reservoir 45 is connected to the input of a pump 55. The pump 55 provides the liquid under pressure along a fluid flow path 60, for supply to the nozzles 40. While use of a reservoir is preferred, any liquid source may be used, including a pipeline.

The liquid flow path 60 may optionally includes a filter 65 to filter out microscopic contaminants from the process liquid. The process liquid, still under pressure, is provided from the output of the filter 65 (if used) along fluid flow line 70. One or more heaters 50 in the liquid flow path heat the process liquid. An in-line heater, or a tank heater, or both, may be used, as shown in FIG. 1.

Ozone is injected into the flow line 70. The ozone is generated by an ozone generator 72 and is supplied along an ozone supply line 80, under at least nominal pressure, to the fluid flow line 70. Optionally, the liquid, now injected with ozone, is supplied to the input of a mixer 90 that mixes the ozone and the process liquid. The mixer 90 may be static or active. From the mixer 90, the process liquid and ozone are provided to the nozzles 40. The nozzles spray the liquid onto the surface of the workpieces 20 and introduce ozone into the environment of the process chamber 15.

To further concentrate the ozone in the process liquid, an output line 77 of the ozone generator 72 may supply ozone to a dispersion unit 95 in the reservoir 45. The dispersion unit 95 provides a dispersed flow of ozone through the process liquid to thereby add ozone to the liquid before injection of a further amount of ozone along the fluid path 60.

In the embodiment of FIG. 1, spent liquid in the chamber 15 is optionally collected and drained via fluid line 32 to, for example, a valve 34. The valve 34 may be operated to provide the spent liquid to either a drain outlet 36 or back to the reservoir 45 via a recycle line 38. Repeated cycling of the process liquid through the system and back to the reservoir 45 assists in elevating the ozone concentration in the liquid through repeated ozone injection and/or ozone dispersion. The spent liquid may alternatively be directed from the chamber 15 to a waste drain.

The ozone generator 72 is preferably a high capacity ozone generator, such as the MKS-Astex 8403 Ozone Generator, manufactured by MKS Instruments, Woburn, Mass., U.S.A. The ozone generator 72 preferably has a capacity of at least 90 or 100 grams per hour, or 110 or 120 grams per hour, with the capacity more preferably of at least 135 grams per hour. In terms of flow rate and concentration, the capacity should be at least 10 liters per minute at 12%, 13%, 14%, 15% (or higher) concentration by weight. For single wafer processing, where the process chamber volume is smaller, lower flow rates and/or higher ozone concentrations, e.g., 16-19% or greater, may be used.

The surface of the workpieces 20 is heated, at least in part, via contact with the heated liquid. The workpieces may also be heated by conduction via heating elements 27 in the supports 25. The chamber 15 may optionally include a chamber heater 29 for heating the chamber and indirectly heating the workpieces. Each of these supplemental heating elements is optional.

The preferred process liquid is de-ionized water. Other process liquids, such as other aqueous or non-aqueous solutions, may also be used. Water can form a continuous film on the workpiece surface. This film or layer, if excessively thick, acts as a diffusion barrier to the ozone, thereby slowing reaction rates. The thickness of this layer is controlled by controlling the spin speed of the workpiece, and controlled spraying of the process liquid, or a combination of one or more of these techniques, to form the liquid layer into a thin boundary layer. This allows the ozone to diffuse through the boundary layer of liquid, to the surface of the workpiece, where it reacts with the organic materials or other contaminants that are to be removed. Ozone has a limited solubility in the heated liquid (preferably water). However, ozone is readily able to diffuse through the liquid boundary layer and react with the surface of the workpiece or wafer (whether it is silicon, photoresist, etc.) at the liquid/solid interface. Thus diffusion, rather than dissolution, along with bulk gas transport as described below, are the primary mechanisms for delivering ozone to the surface of the wafers. The presence of the gas in the chamber and liquid layer on the workpiece are a means for diffusing the gas through the liquid layer, for reaction at the workpiece surface, or at contaminants on the workpiece surface.

Figure 2:
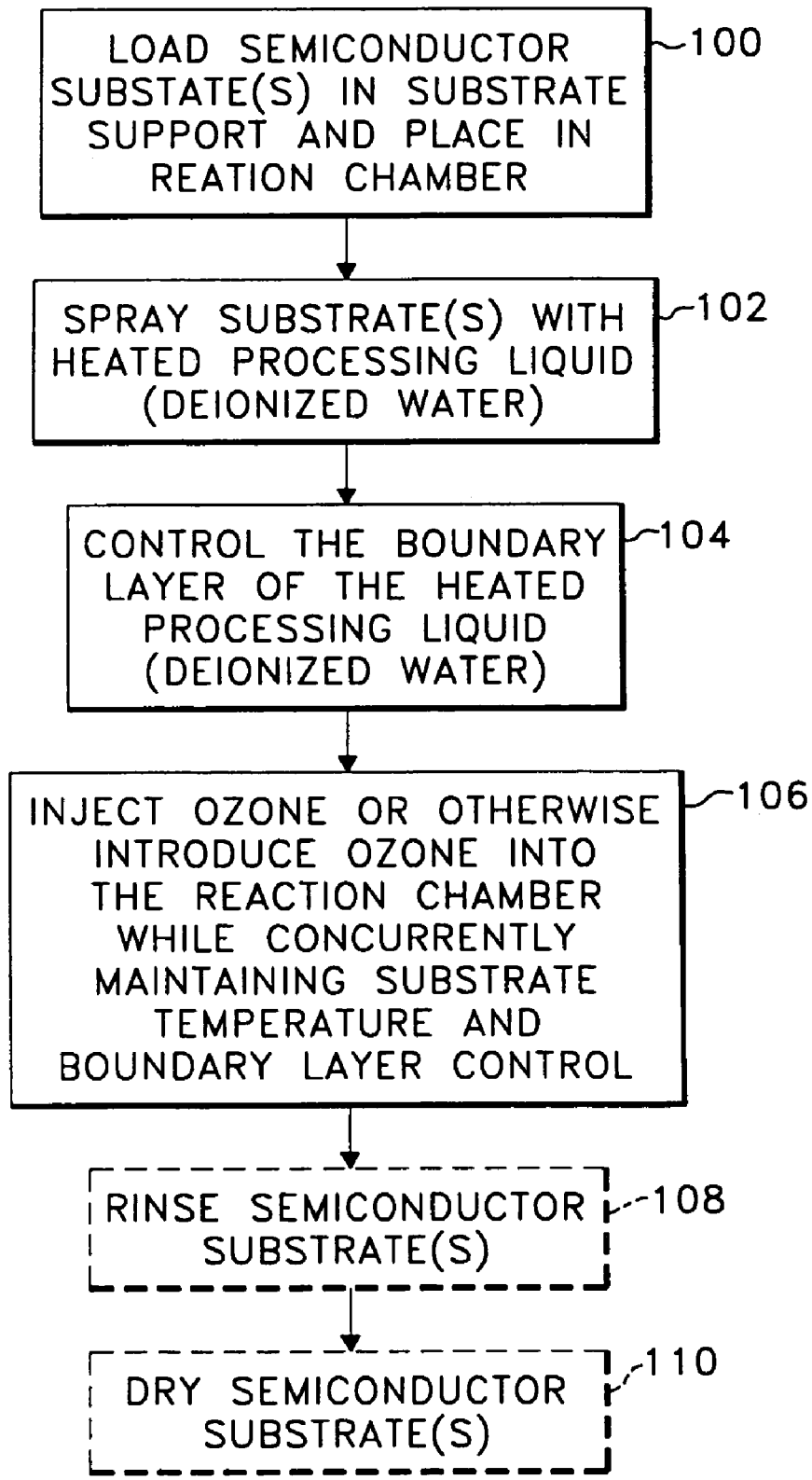
FIG. 2 is a diagram illustrating a process flow for cleaning or processing a workpiece using a liquid and ozone.

FIG. 2 shows an example of a process that may be performed in the system of FIG. 1 when the system 14 is used, for example, to strip photoresist from the surfaces of a workpiece. At step 100, the workpiece 20 to be stripped is placed in, for example, a holding fixture on the rotor assembly 30. For batch processing, a batch of workpieces may be placed into a cassette or carrier 130, as shown in FIG. 15. Alternatively, for batch operations, the workpieces 20 may be disposed in a rotor or fixture in the chamber 15 directly, without a carrier, as described in U.S. Pat. No. 5,784,797, incorporated herein by reference. FIG. 14 shows a similar non-automated system having a single process chamber 15. A stationery fixture or holder, such as a simple rack, may be used as the fixture to hold the workpiece in non-rotating designs. The process chamber 15 may be heated by a chamber heater 29 in the form of, for example, one or more embedded heated recirculating coils or a heating blanket, or irradiation from a thermal source (e.g., and infrared lamp), etc.

At step 102, heated deionized water is sprayed onto the surfaces of the workpiece(s) 20. The heated deionized water heats the surfaces of the workpiece(s) 20 as well as the environment of the chamber 15. Corrosion inhibitors and surfactants may also be used.

The surface boundary layer of deionized water is controlled at step 104 by rotating the workpiece; adjusting the flow rate of the deionized water, or by providing the deionized water in a fine spray. At step 106, ozone is injected into the fluid flow path 60 during the water spray, or otherwise provided directly into the chamber 15. If the apparatus of FIG. 1 is used, the injection of the ozone preferably continues after the spray of water is shut off. The liquid boundary layer thickness may range from a few molecular layers (e.g., about 1 micron), up to 100 microns, (typically 50-100 microns), or greater. After the workpiece(s) 20 have been processed through the reactions of the ozone and/or liquid, the workpiece(s) are optionally rinsed at step 108 and are dried at step 110. The water and/or ozone flow may be pulsed at distinct intervals to help create and control the boundary layer, with or without the other techniques. Pulsation may occur on a frequency ranging from fractions of a second to minutes, with ozone and water being pulsed at the same frequency, cycled alternately or overlapping.

While ozone has a limited solubility in the heated deionized water, the ozone is able to diffuse through the water boundary layer and react with photoresist at the liquid/resist interface. The deionized water itself apparently further assists in the reactions by hydrolyzing the carbon-carbon bonds of organic deposits, such as photoresist, on the surface of the wafer. The high concentration of ozone in the gas phase promotes diffusion of ozone through the liquid boundary layer, even though the high temperature of the liquid layer does not actually have a high concentration of dissolved ozone.

Elevated or higher temperatures means temperatures above ambient or room temperature, that is temperatures above 20 or 25° C. and up to about 200° C. Preferred temperature ranges are 25-150°, more preferably 55-120 or 75-115° C., and still more preferably 85-105° C. In the methods described, temperatures of 90-100° C., and preferably centering around 95° C. may be used. Under nominal conditions, and using an unpressurized process chamber with water as the process liquid, preferred temperature ranges for the liquid are 25 or 30 to 99° C., or 35 or 40 to 99° C.

Use of lower temperatures (between 25 and 75° C. and preferably from 25-65° C. (rather than at e.g., 95° C. as described above) may be useful where higher temperatures are undesirable, such as when metal corrosion may occur if the metal films on the workpiece are exposed to high temperature de-ionized water. Correspondingly, processing at ambient temperatures may be preferred. The gain in strip rates not realized, as a result of not using higher temperatures, is offset by increases in strip rate due to the increased ozone flow rates and concentrations. The use of higher ozone concentration can offset the loss of kinetic energy from using lower temperatures.

Figure 3:
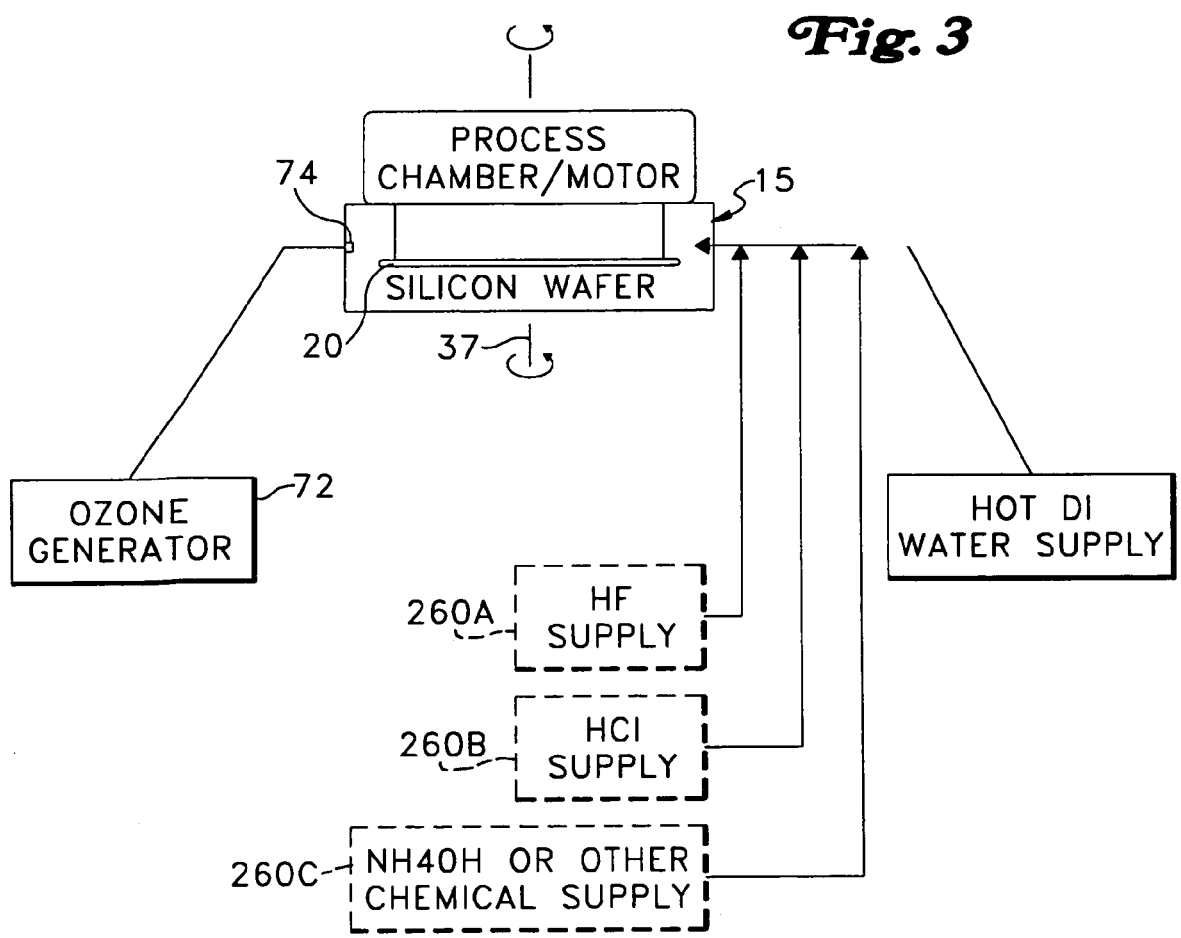
FIG. 3 is a schematic diagram of an apparatus for cleaning or processing a workpiece in which the semiconductor workpiece using a liquid and ozone, and a chemical additive.

A single processing liquid may be used to remove organic contaminants, metals, and particles in a single cycle of process steps 102-106. The processing liquid may be a solution of deionized water and one or more compounds, such as HF or HCl, from chemical reservoirs 260A or 260B, to form an acidic processing liquid solution, as shown in FIG. 3.

With the use of HF and ozone, the boundary layer is preferably maintained thick enough to achieve good etch uniformity, by selecting flow rates of liquid onto the workpiece surface, and removal rates of liquid from the workpiece surface. The boundary layer of the liquid on the workpiece surface is preferably maintained thick enough so that the etch uniformity is on the order of less than 5%, and preferably less than 3% or 2% (3-sigma divided by the mean). In the HF and ozone process, the ozone concentration is preferably about 3-35% or 10-20% by weight (in oxygen). HF concentrations used are typically 0.001 to 10% or 0.01 to 1.0% (by weight). In general, the lower concentrations are preferred, with a concentration of about 0.1% providing very good cleaning performance. The HF solution may include HCl to enhance metal removal capability.

The steps and parameters described above for the ozone processes apply as well to the ozone with HF and ozone process. These processes may be carried out on batches of workpieces in apparatus such as described in U.S. Pat. No. 5,544,421, incorporated herein by reference, or on individual workpieces in an apparatus such as described in PCT/US99/05676, incorporated herein by reference. Typical chemical application times are in the range of 1:00 to 5:00 minutes.

A processing liquid of water and ammonium hydroxide can be used to remove photoresist and anti-reflective coating in a single processing step (e.g., the steps illustrated at 210-215), generally with concentrations between 0.02% and 0.04% ammonium hydroxide by weight in water. The ammonium hydroxide may be added to hot DI water from a storage reservoir 260C as shown in FIG. 3. TMAH (tetra-methyl ammonium hydroxide) may also be use in place of ammonium hydroxide.

Figure 4:
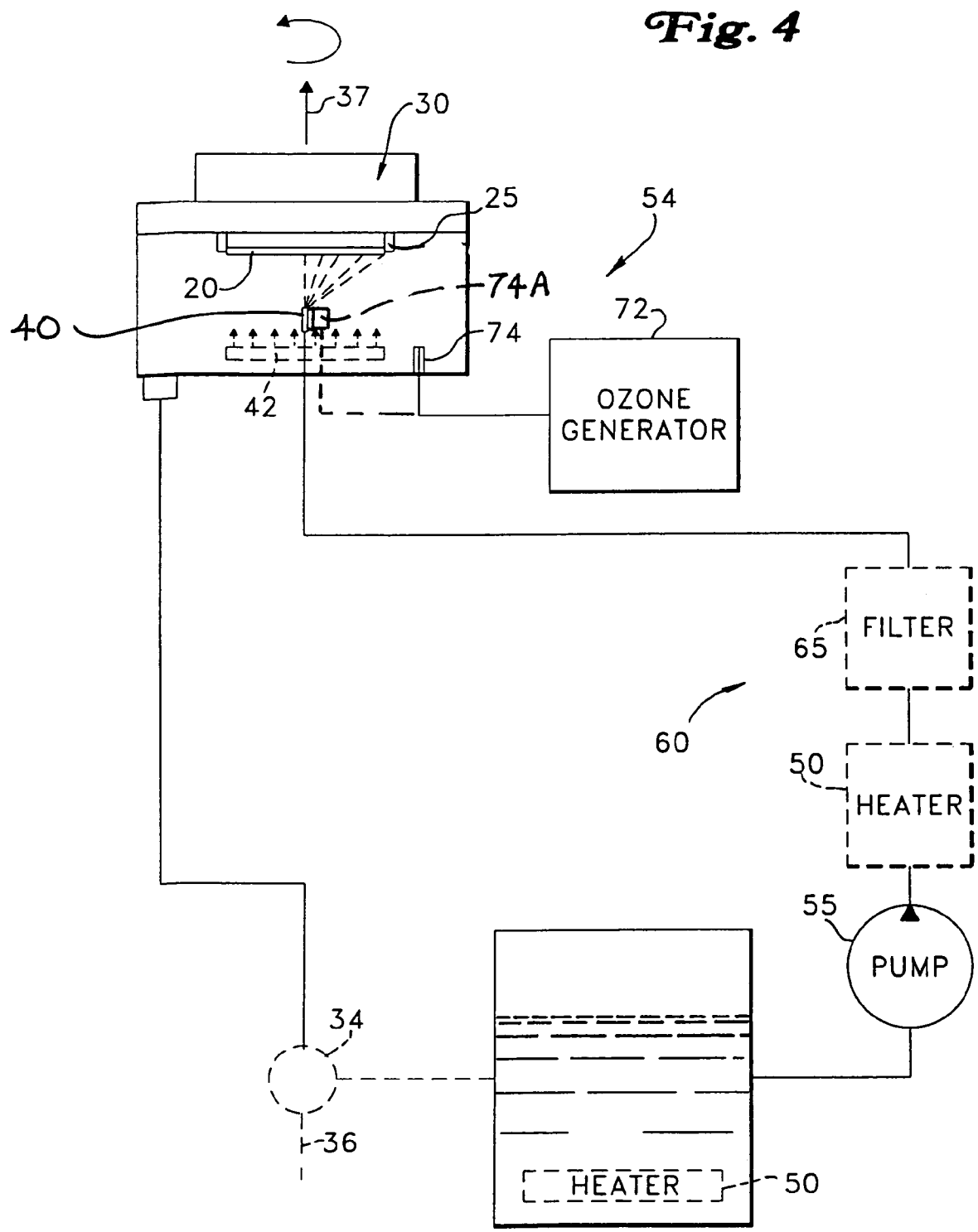
FIG. 4 is a schematic diagram of an apparatus for cleaning or processing a workpiece using a process gas, such as ozone and a liquid, with the process gas supplied into the process chamber, rather than into the liquid as shown in FIG. 1.

With reference to FIG. 4, in another ozone diffusion process system 54, one or more nozzles 74 are disposed within the process chamber 15 to provide ozone from ozone generator 72 directly into the chamber. Injection of ozone into the fluid path 60 is optional. The system of FIG. 4 is otherwise the same as the FIG. 1 system described above.

Referring still to FIG. 4, in an alternate design, an ozone or gas nozzle 74A is associated with, adjacent to, or part of, the liquid spray nozzle 40. Some of the ozone gas (or any other process gas which may be used) emerging or sprayed or jetted out of the gas nozzle 74A is physically entrained into the liquid, and is carried with the liquid to the workpiece surface. This bulk transport of ozone gas increases the amount of ozone available for reaction at the workpiece surface. When the ozone gas entrainment nozzles are used, molecules of ozone are carried along with the liquid to the workpiece surface. Some of the entrained ozone may dissolve into the liquid, depending on temperature and other factors. However, typically more of the entrained ozone will be carried along with the movement of the liquid spray droplets.

Figure 16:
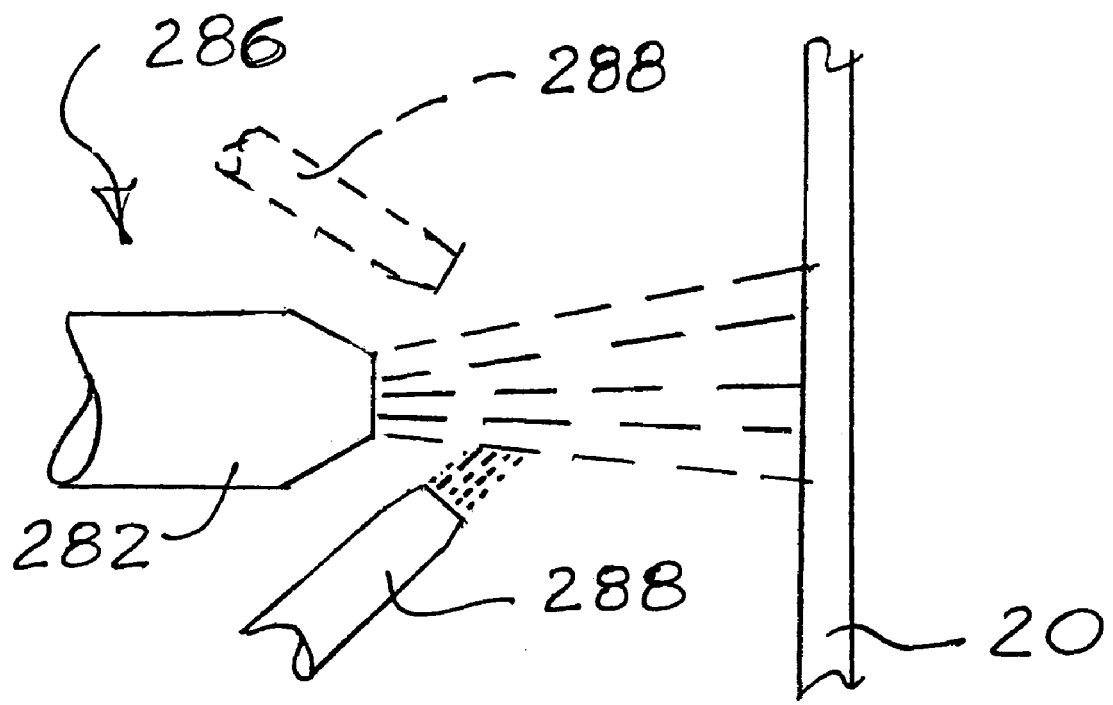
FIG. 16 is a schematic side view of a gas entrainment nozzle arrangement for use in the systems shown in FIGS. 1-6, 14 or 15.
Figure 17:
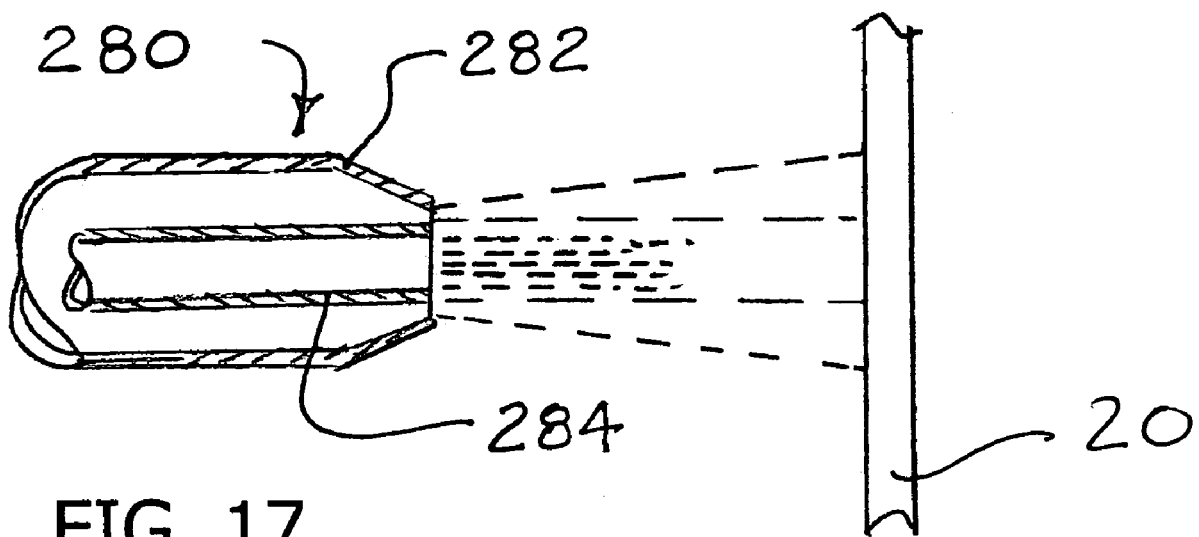
FIG. 17 is a schematic side view of another gas entrainment nozzle arrangement for use in the systems shown in FIGS. 1-6, 14 or 15.

Turning momentarily to FIGS. 16 and 17, the ozone may be entrained in the liquid 58 in various ways. As shown in FIG. 16, one or more gas nozzles 288 may be placed alongside of a liquid nozzle 282, optionally at an angle causing the gas flow, shown as dotted lines, to intersect with the liquid flow, shown as dashed lines. The positions of the nozzles may also be switched, i.e., with one or more liquid nozzles around the outside of one or more gas nozzles. FIG. 17 shows another entrainment arrangement or nozzle 280, having an outer flow line 282 surrounding an inner flow line 284. Process gas such as ozone flows through one of the flow lines and the process liquid 58 flow through the other. As they exit the nozzle 280, gas is entrained in the spray of liquid droplets.

In the gas entraiment designs shown in FIGS. 4, 16 and 17, steam can be used in place of the liquid 58, with the gas entrained with, or carried along with, the steam impinging the workpieces. Various other nozzle designs, in addition to the nozzles 286 and 280 may be used, for example aspiration nozzles or fractionating nozzles, as means for entraining gas. Atomizing nozzles or spray heads may also be used, to form an atomized or aerosol stream, thereby increasing the available surface area and the bulk transport of gas to the workpiece, using the liquid or steam as a vehicle. In addition to diffusion, entraining the gas into the liquid or steam sprayed or jetted at the workpiece provides an additional way of bringing the gas into contact with the workpiece. Regardless of the entrainment technique used, some of the ozone or process gas will not become entrained or stay entrained. This free ozone gas then fills the chamber and is available to diffuse through the liquid layer.

Entraining the gas into the liquid or steam is preferably used with diffusion of the gas introduced into the chamber via the nozzles or openings 74. Using both delivery techniques or mechanisms, i.e., diffusion and entrainment, increases transport of gas to the workpiece surface. For some applications, entrainment may be used alone, without diffusion, i.e., without gas separately provided into the chamber via a chamber gas nozzle 74. The use of gas entraiment provides for many of the benefits of gas diffusion, but can reduce the amount of gas needed. When using both chamber gas nozzles 74 and entrainment nozzles 74A are used, the concentration of gas in the chamber surrounding the workpiece need not be as high as when chamber gas nozzles alone are used (with no gas entraiment).

While the diffusion and entrainment methods are primarily described here in relation to ozone gas, other gases may similarly be used. Hence, reference to ozone gas or process gas means any process gas. Hydrogen gas may be used to create a reducing environment for removal of metal ion contamination. Even gases considered to be inert, such as nitrogen, may be used to impart a favorable charge to the wafer surface. This can be helpful in creating an electrical repulsion of particles, reducing particle re-adhesion to the surface of the workpiece. Other gases may be used in specific applications. Hydroflouric acid (HF) can be used to provide silicon dioxide etch capability. Ammonia can used to elevate pH for particle removal capability.

Figure 5:
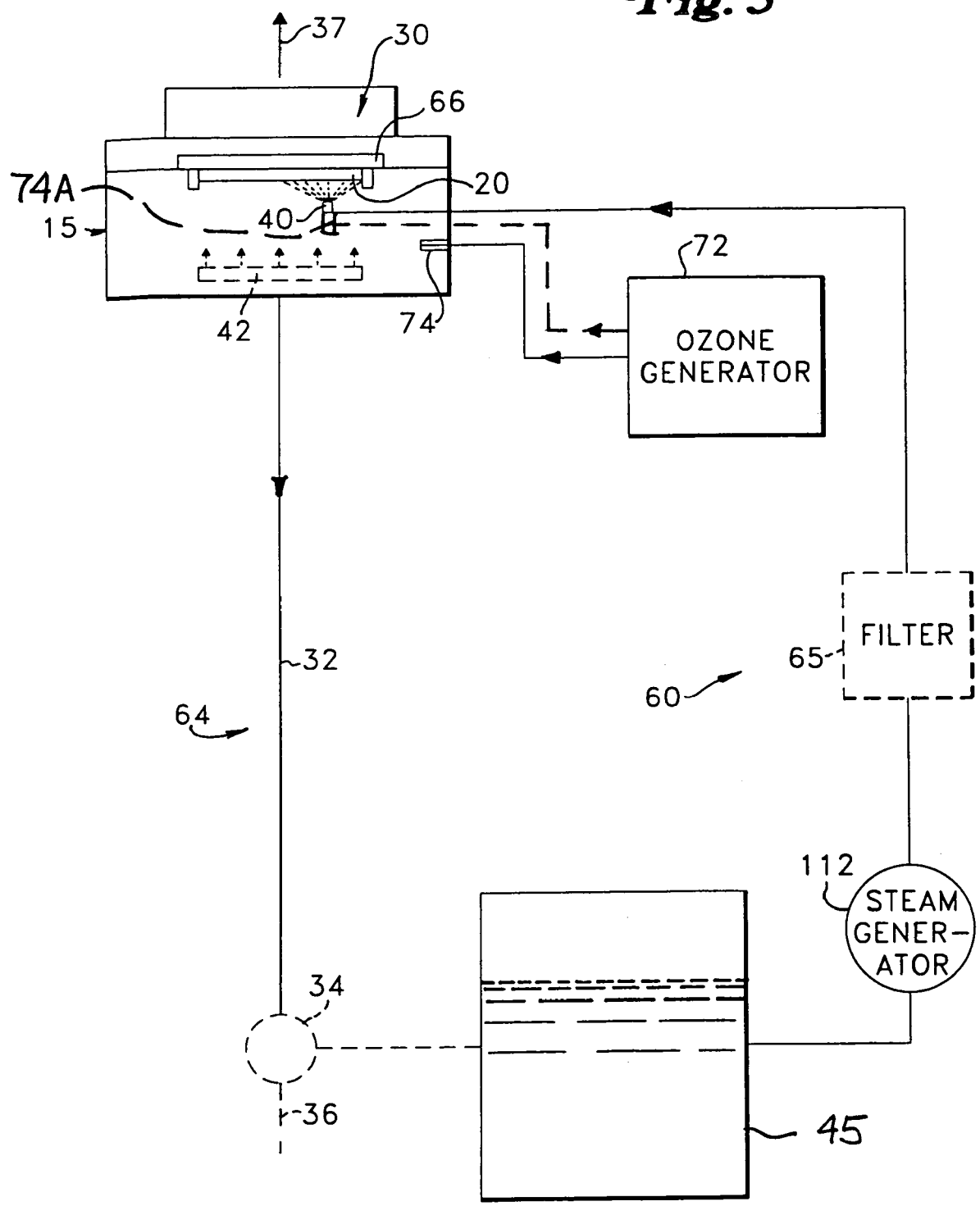
FIG. 5 is a schematic diagram of an apparatus for cleaning or processing a workpiece using pressurized steam and ozone.

Referring to FIG. 5, in another system 64, a steam source or boiler 112 supplies saturated steam under pressure to the process chamber 15. The reaction chamber 15 is preferably sealed to form a pressurized atmosphere around the workpiece. Ozone may be directly injected into the chamber 15 as shown, and/or may be injected into the path 60 for concurrent supply with the steam. With this design, workpiece surface temperatures exceed 100 degrees C., further accelerating the oxidation reactions. While FIGS. 4 and 5 show the fluid and ozone delivered via separate nozzles 40, they may also be delivered from the same nozzles, using appropriate valves. Entrainment nozzles 74A or techniques may also be use with steam.

To maintain condensation of steam on the workpiece surface, the workpiece surface must be maintained at a temperature lower than the steam delivered to the process chamber. This may be achieved by attaching the wafer to a temperature-controlled plate 66, as shown in FIG. 5, which will act as a heat sink. This surface may then be temperature controlled either through the use of cooling coils, a solid-state heat exchanger, or other means.

A temperature-controlled stream of liquid can also be delivered to the back surface of a workpiece. As with all of the methods described here, the workpiece or wafer may be rotated to promote uniform distribution of the boundary layer, as well as helping to control or maintain the thickness of the liquid layer through centrifugal force. However, rotation is not essential (in any of the systems in any of the Figures). If the cooling stream is water, a temperature of 75 or 85 to 95 C is preferably used, with steam temperatures in excess of 100 C. Pulsed spray of cooling liquid can be applied periodically to reduce the wafer temperature. Steam delivery may either be continuous or pulsed as well.

Figure 6:
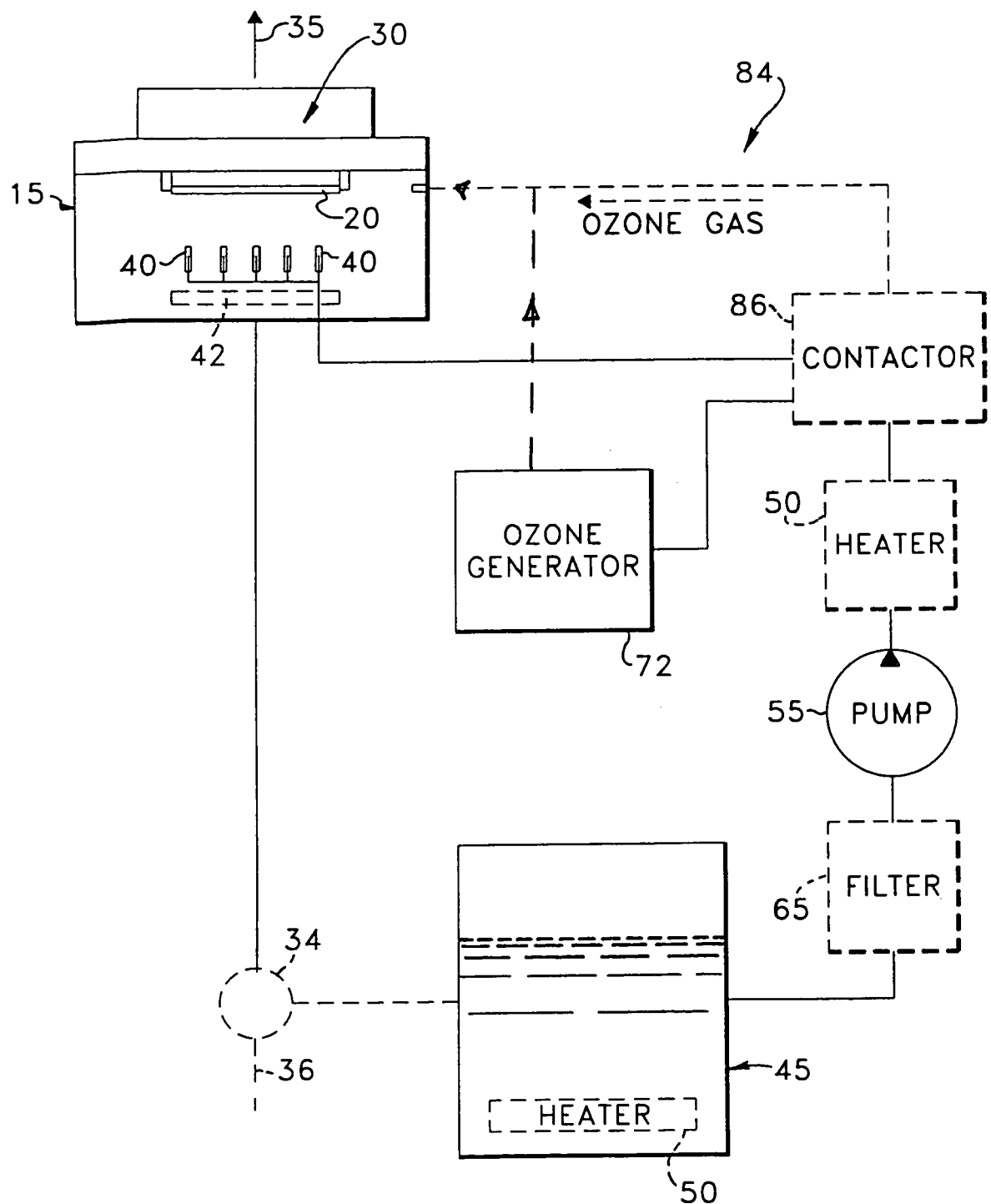
FIG. 6 is a schematic diagram of an apparatus for cleaning or processing a workpiece using liquid/gas contactors to enhance the kinetic reactions at the surface of the workpiece.

As shown in FIG. 5, an ultra-violet or infrared lamp 42 is optionally used in any of the systems described here, to irradiate the surface of the workpiece 20 during processing. This enhances the chemical reactions and speeds up processing. Megasonic or ultrasonic nozzles 40 may also be used. With reference to FIG. 6, in another system 84, one or more liquid-gas contactors 86 are used to promote the dissolution of ozone into the liquid. The contactors are especially useful when the temperature of the processing liquid is near ambient.

Figure 7:
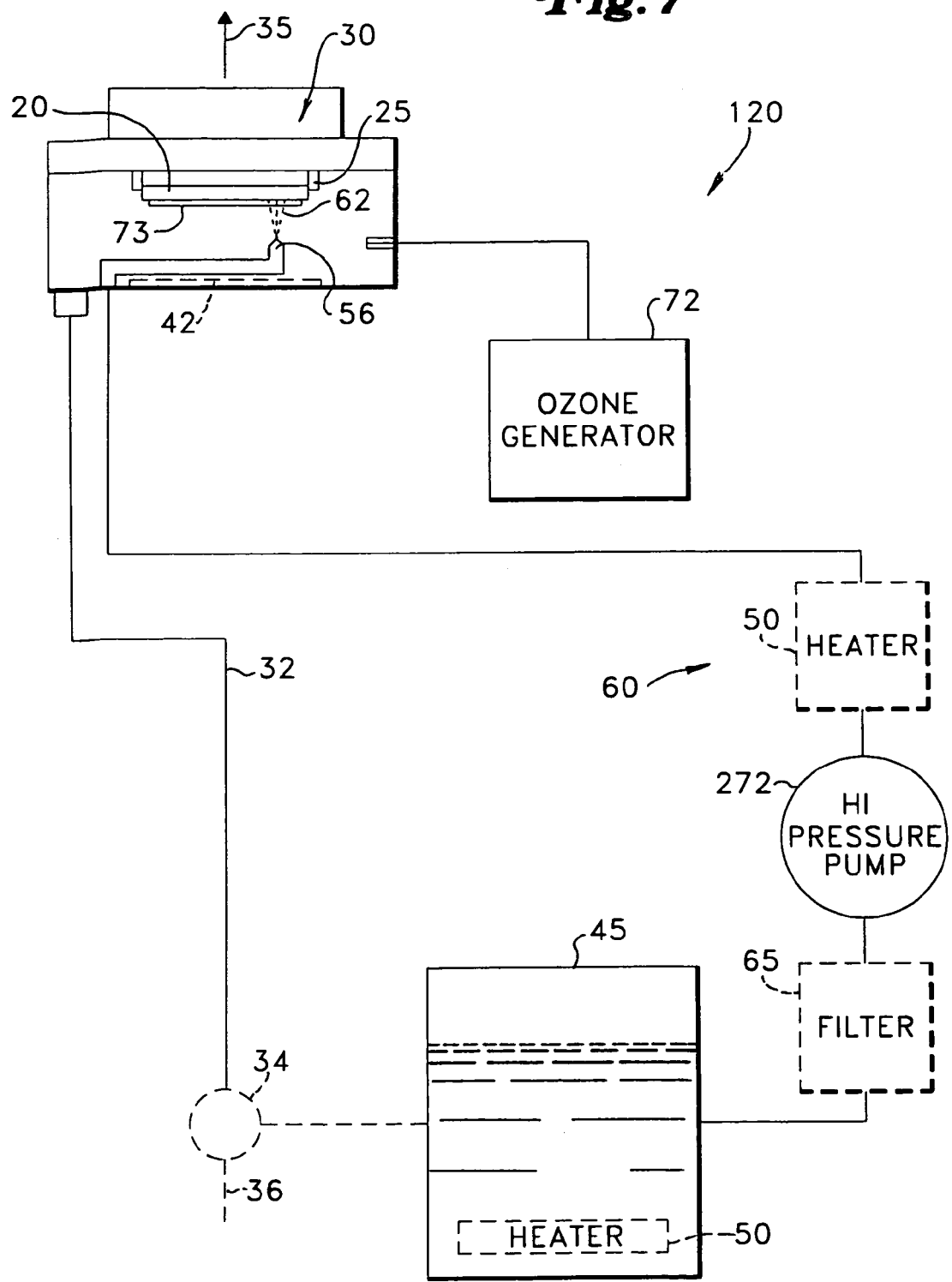
FIG. 7 is a schematic diagram of an apparatus similar to the apparatus of FIG. 4 and applying liquid onto the workpiece in a high pressure jet.

Referring to FIG. 7, another alternative system 120 is similar to the system 54 shown in FIG. 4, except the system 120 does not use the spray nozzles 40. Rather one or more jet nozzles 56 are used to form a high pressure jet of liquid. The liquid 58 formed into the high pressure jet 62 penetrates through the boundary layer 73 of liquid on the workpiece surface and impinges on the workpiece surface with much more kinetic energy than in conventional water spray processes. The increased kinetic energy of the jet physically dislodges and removes contaminants.

A high pressure pump 272 preferably pressurizes the liquid 58 to a pressure of from 100-15,000 psi, or 500-2000 psi and more preferably to approximately 400-800 psi. These pressures and the nozzle orifice diameter and jet diameter of 0.5-10 mm, result in formation of a jet 62 or a substantially solid or continuous column of liquid impacting the workpiece at a velocity of 1-100 meters/second. In the spray systems shown in FIGS. 1-6, liquid is formed into a spray or aerosol formed of small liquid droplets. The spray tends to spread outwardly as it moves away from the nozzle, as shown in FIGS. 16 and 17, and covers a relatively broader area of the workpiece. On the other hand, with the jet nozzles and system shown in FIGS. 12A, B and C, far fewer droplets are formed. A concentrated jet or beam of liquid impacts on a small spot on the workpiece. Unlike with spray systems, with the jet systems, the impact of the liquid contributes to the processing. The velocity of the liquid jet is limited largely only by the pump pressure and flow limitations, and the need to avoid damaging the workpiece. While continuous flow is preferred, an interrupted or intermittent flow, to form discrete liquid impacts, may also be used.

Figure 10:
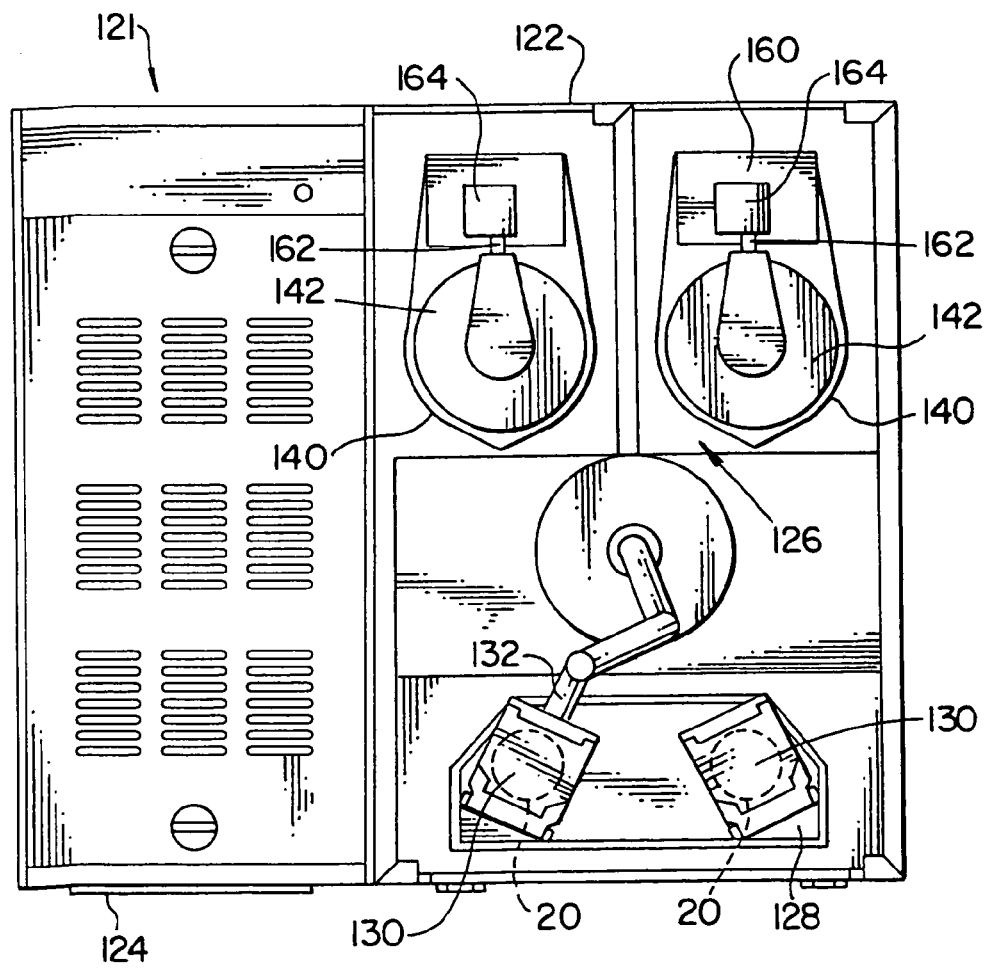
FIG. 10 is a top view of the system shown in FIG. 9.

The liquid jet system shown in FIG. 7 may be included in an apparatus for handling and cleaning or processing workpieces. FIGS. 8-13 show optional further designs and features which may be used with the liquid jet system of FIG. 7. As one example, referring to FIG. 9, an apparatus 121 including the jet system includes a control panel 124 and a process bay or space 126 within an enclosure 122. As shown in FIG. 10, a robot arm 132 is positioned in between a load/unload section 128, and the process section 126. Workpiece containers or carriers 130, typically holding a batch of workpieces 20, are moved into and out of the load/unload section 128, as workpieces are cycled through the system 121 for cleaning.

Figure 11:
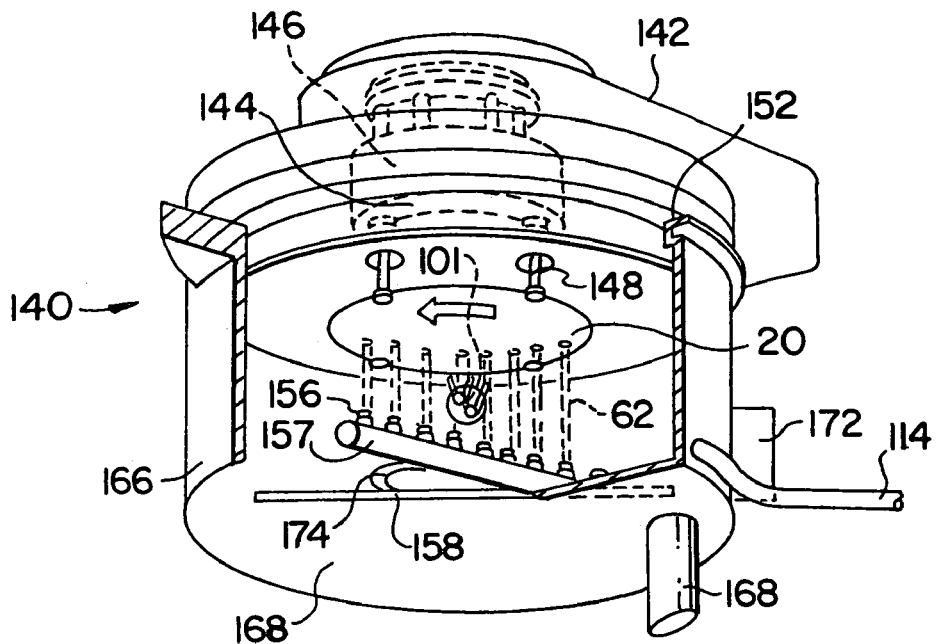
FIG. 11 is a perspective view, in part section, of a process chamber, for use in any of the apparatus shown in FIGS. 1-10.

Process chambers 140 are positioned within the process section 126. In the design shown, two process chambers 140 are used. However, for certain applications, a single process chamber 140 may be sufficient, whereas in other applications, several process chambers, e.g., three, four, five, six or more, may be used. Referring now to FIGS. 10 and 11, each process chamber 140 includes a head 142 having a fixture, or fingers 148 for holding a workpiece 20. One or more jet nozzles 56 are provided on a manifold 157 within the process chamber 140. The manifold 157 is advantageously movable along a manifold track 158, via a track motor 172. A supply line 174 supplies high-pressure liquid to the one or more nozzles 56.

The head 142 of the process chamber 140 preferably (but not necessarily) includes a rotor 144 attached to the finger holders or fixture 148. A motor 146 is then provided in the head 142 to spin the rotor 144, and the workpiece 20. In this way, a jet 62 of high-pressure liquid from the one or more jet nozzles 56 can contact substantially all areas of the bottom surface of the workpiece 20, via the rotation of the workpiece 20 and the preferably linear movement of the jet nozzle 56. Alternatively, the jet nozzle 56 may be fixed in position (without any manifold 154 used) and the workpiece 20 rotated with precession by the rotor 144. As another alternative, the workpiece 20 and jet nozzle 56 may both remain stationary, while the jet of high-pressure liquid is steered via a nozzle or jet steering device, so that the jet passes over substantially all of the lower surface of the workpiece 20.

Referring to FIG. 10, a head elevator 160 attached to the head 142 is provided to raise and lower the head 142 onto and away from the bowl 166 of the process chamber 140, to load and unload a workpiece into the head 142. The head 142 is attached to the head elevator 160 by a head pivot shaft 162. A pivot drive motor 164 turns the head pivot shaft 162 and the head 142, typically by 180°, so that the head is upfacing, for loading and unloading, and downfacing, for processing. A drain 168 near the bottom of the bowl 166 removes spent liquid, as shown in FIG. 11. A seal 152 is optionally provided between the head 142 and bowl 166.

In an alternative process chamber 180, as shown in FIG. 12A, a jet nozzle 56 is provided on a swing arm assembly 190. The swing arm assembly 190 is supported on an axle 212 extending down through a pivot collar 210 passing through the bottom of a bowl 166. An arm elevator 214 is connected to the axle 212 through a bearing or bushing 215. The arm elevator 214 is connected to an arm elevator motor 216. The axle 212 is also directly or rigidly connected to an arm pivot linkage 218 driven by an arm pivot motor 220. Consequently, the swing arm assembly 190 can be raised or lowered by the arm elevator motor 216, and can also independently be pivoted by the arm pivot motor 220. A rinse chamber 230 and a rinse spray nozzle 232 may be provided on one side of the bowl 166, for rinsing and cleaning off the swing arm assembly 190. The process chambers 15 and 180 are chamber means.

Figure 8:
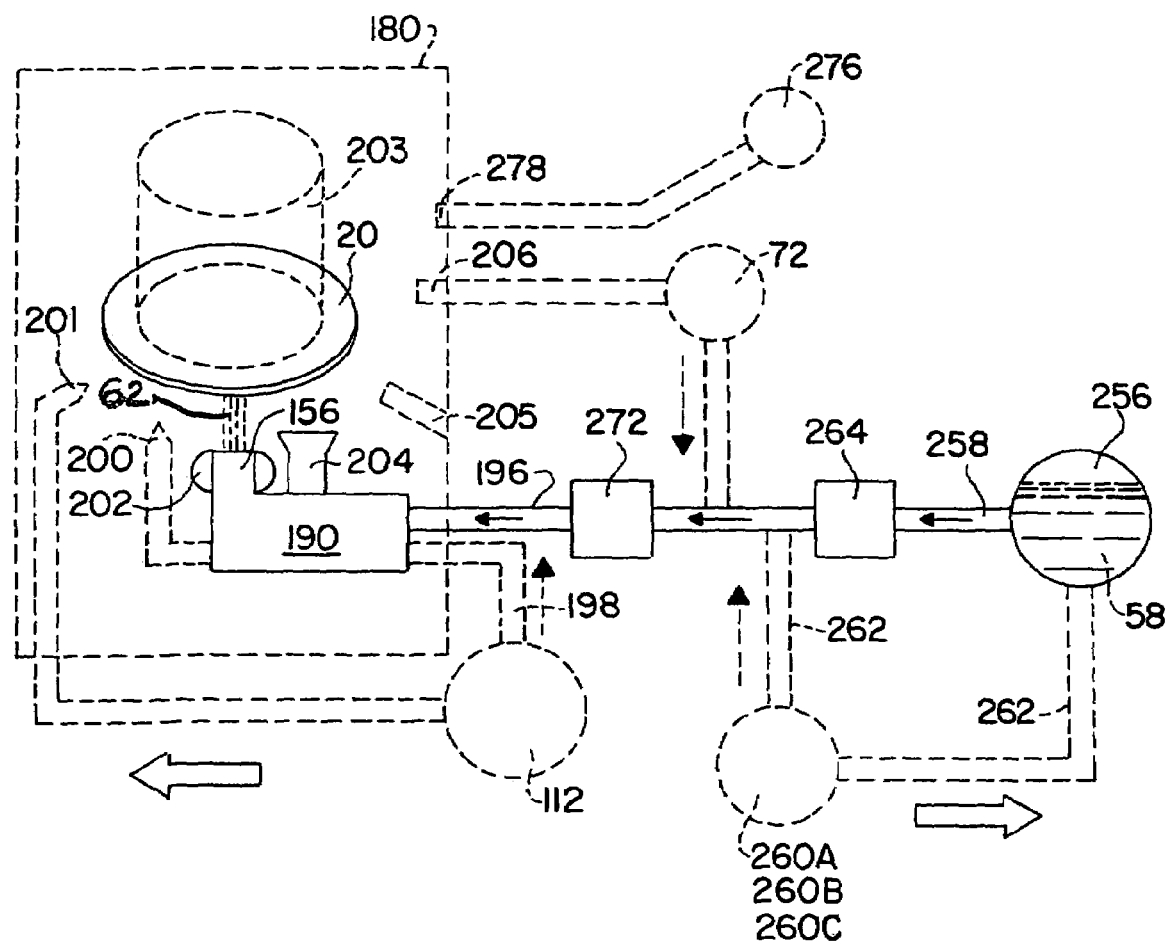
FIG. 8 is a schematic diagram of the apparatus shown in FIG. 7 with additional features.
Figure 9:
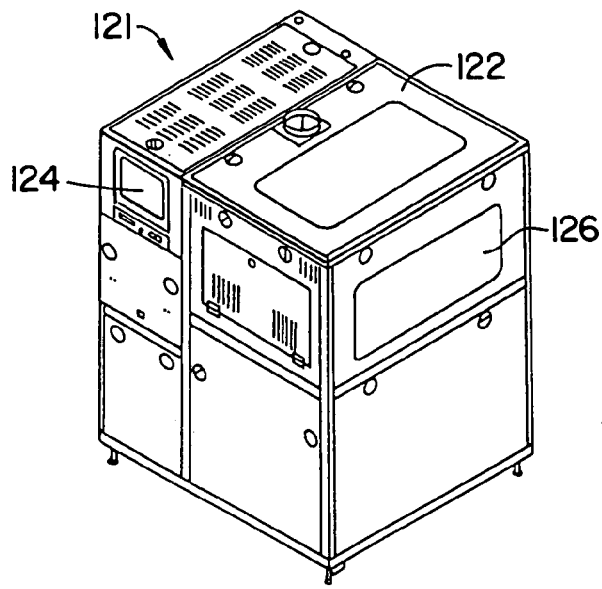
FIG. 9 is a perspective view of a cleaning system including one or more of the apparatus shown in the Figs. listed above.

As shown in FIGS. 8 and 12A, a high-pressure liquid feed line 196 connects to the jet nozzle 56, preferably through the axle 212 and swing arm assembly 190. A steam feed line 198 may optionally similarly connect to a steam spray nozzle 200 attached to or on the swing arm assembly 190. Sonic transducers 202, such as ultrasonic or megasonic transducers, may be provided around the nozzle 56 on the swing arm assembly 190, to impart sonic energy into the jet of high pressure liquid emanating from the nozzle 56. An electromagnetic radiation source is also optionally provided on the swing arm assembly, to direct radiation at the workpiece 20. The electromagnetic radiation may be ultraviolet, infrared, microwave, gamma, or x-ray radiation. An electrical power line, fiber optic cable, or waveguide 208 connects to the electromagnetic radiation source 204, through the axle 212 and swing arm assembly 190.

Referring now to FIG. 8, the jet fluid 58 (typically DI water) is stored in bulk in a tank or vessel 256 connected to a heater 264 by a supply line 258. When the liquid 58 is water, the heater 264 may be set to heat the liquid 58 to a temperature of from, e.g., 25°-99° C., and preferably from 30°-95° C., when using water as the liquid or principal liquid component. A liquid chemical source or tank 260 is optionally connected to the liquid tank 256 by a chemical delivery line 262. Alternatively, the chemical supply tank 260 may be connected into the liquid supply line 258 at a point downstream of the heater 264. An ozone generator 72 is optionally connected into the liquid supply line 258, downstream of the heater 264, to supply ozone into the liquid. The ozone generator 72 may also be connected into the process chamber 180, at an ozone entry port 206 to supply ozone gas directly into the chamber. A chiller or liquid cooler may be provided with or instead of the heater 264, if chilled liquid (having higher density and greater kinetic energy impact on the workpiece) is desired.

The liquid supply line 258 from the heater 264 connects into a high-pressure pump 272, which pressurizes the liquid flowing into the feed line 296 extending up to the nozzle 56. A chemical gas supply 276 connecting into a chemical gas port 278 in the process chamber 180 may optionally be provided, in addition to the ozone generator 72. A steam generator or boiler 112 connected to the steam line 198 on the swing arm assembly 190, may also be provided. The specific sources of the liquids and gases, and the piping connections to them, are not essential aspects. Indeed, the systems can be provided without any liquid or gas storage elements, if the liquids are gases are supplied by the factory or building installation.

Referring to FIG. 12A, a sonic transducer 203 may be provided on the head 142, in contact with the workpiece 20 held by the holders or fixture 148. The direct contact transducer 203 may be a megasonic or ultrasonic transducer, and may be used in place of, or in addition to, the sonic transducers 202 at the nozzle 56. Steam nozzles 201 supported on the inside surface of the bowl 166 and connected to the steam generator 112 may be used instead of, or in addition to, the steam nozzle 200 on the swing arm assembly 190. In addition, electromagnetic radiation sources 205, such as a UV lamp, may be provided within the process chamber 180 to irradiate the surface of the workpiece 20.

Figure 13:
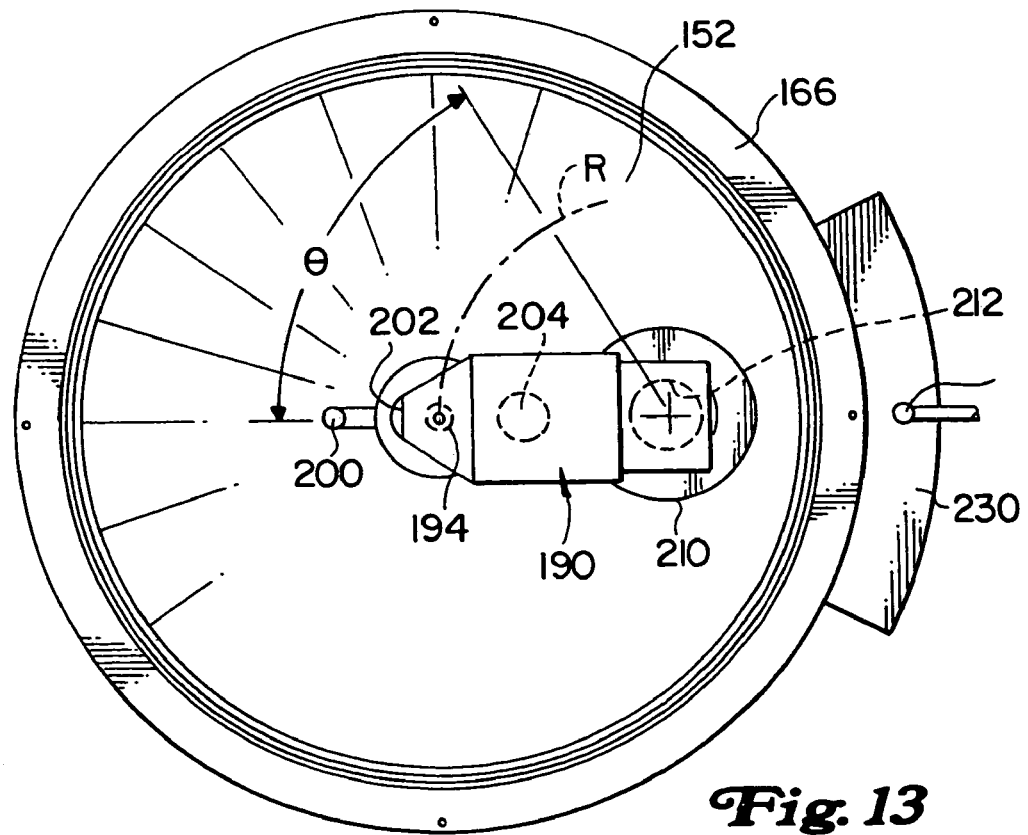
FIG. 13 is a top view of the chamber shown in FIG. 12.

The foregoing description of the design and features shown in FIG. 12A applies as well to the embodiment shown in FIG. 11, having a linearly moving nozzle (instead of a nozzle moving along a radius R as shown in FIG. 13). The foregoing description similarly applies as well to an embodiment having a fixed nozzle and a workpiece which rotates and translates or precesses or otherwise moves to expose substantially all (downward facing) surfaces of the workpieces to the jet 62.

The liquid and gas chemical additives, irradiation sources and sonic transducers are not essential to the systems or methods, but may be preferred in some applications. The heater, ozone, and steam while preferred for many applications, may also be omitted. The essential features comprise the jet of high pressure liquid, movement of the jet over the workpiece surface, and use or a process gas. The valves, meters, filters and other standard components and techniques well known in the design of fluid systems have been omitted from FIG. 8, for clarity of illustration.

Referring to FIG. 10, in use, a workpiece container or carrier 130 (if used) is moved into the load/unload section 128 of the cleaning system 121. The robot 132 removes a single workpiece from the carrier 130. The head 142 of the process chamber 140 to be loaded is upfacing. The robot 132 places the workpiece 20 into the holders or fixture 148 on the upfacing head 142. The pivot drive motor 164 is then energized to pivot the head 142 (typically 180°) into a downfacing position. The head elevator 160 then lowers the head 142 and workpiece 20 down until the head 142 engages with the bowl 166. The fixture 148, or the rotor assembly 30, carrier 130 or stationary fixture or holder are holding means.

Referring to FIG. 11, with the head 142 engaged onto the bowl 166, and optionally sealed via the seal 152, the head spin motor 146 is energized to rotate the workpiece 20. High pressure fluid is provided to the one or more nozzles 56 by the supply line 258 and the pump 272. The track motor 172 is energized to move the one or more nozzles 56 linearly within the process chamber 166. The spinning movement of the workpiece 20 and linear movement of the one or more nozzles 56 ensures that substantially all of the surfaces of the workpiece 20 facing the nozzle 56 are contacted by a jet 62 of the high-pressure liquid.

The operation of the embodiment shown in FIG. 12A is similar to the operation as described above regarding FIG. 11, except that the nozzle 56 moves on a radius R, as shown in FIG. 13, about the axle 212. The electromagnetic radiation source 204, sonic transducer 194 and steam nozzle 200 (if used) which move with the liquid jet nozzle 56 on the swing arm assembly 190 in FIG. 12A, may also be provided on the manifold 154, or other structure around the nozzle 56, in the design shown in FIG. 11, to provided electromagnetic radiation, sonic, and steam sources which move with the jet nozzle 56. FIGS. 11 and 12 are two examples of the various types of machines or systems that can be used to perform the processing or cleaning methods described.

Although the jet nozzles 56 are preferably oriented so that the jet 62 is perpendicular to the workpiece 20, jets striking the workpiece at an angle may also be used. Although the jet nozzles in FIGS. 11 and 12A are positioned below the workpiece, the jet nozzles and workpiece may be oriented with the nozzle vertically above the workpiece, or at one side of the workpiece. FIGS. 12B and 12C show alternative jet nozzles which may be used in the systems shown in FIGS. 8-13. As shown in FIG. 12B, the jet nozzle may have concentric or inner and outer flow paths or tubes, with the inner flow path 292 carrying liquid, and with the outer flow path or tube carrying a process gas, or vice versa. FIG. 12C shows another jet design having one nozzle or outlet 296 for liquid and one or more separate and adjacent outlet or nozzle 294 for process gas. The liquid and gas nozzles or outlets may be oriented so that they range from parallel to perpendicular to each other. FIG. 12C shows an example where they are oriented at an angle AN ranging from 10-80°.

While FIGS. 8, 11 and 12A show the jet nozzles spaced apart from the workpiece, the jet nozzles, or the spray head supporting them, may be positioned, or moved into a position, very close to the workpiece, e.g., within 1-40, 2-20 or 30, or 4-16 mm. As shown in dashed lines in FIGS. 12B and 12C, with jet nozzles having separate liquid and gas outlets, either the gas or the liquid outlet or nozzle may extend beyond the other, so as to be closer to the workpiece. In some applications, it may be advantageous to have the gas outlet(s) or nozzle(s) closer to the workpiece, so that the gas makes better direct impact or contact with the workpiece, via bulk transport flow.

Referring to FIGS. 8, 11, and 12, the liquid within the tank 256 is preferably water, or de-ionized water. However, in these and indeed in all of the systems described here, other liquids may be used, alone, or mixed with water. For example, organic solvents such as isopropyl alcohol, n-methyl pyrolidone, or acids such as sulfuric acid, phosphoric acid, or HF, halogenated hydrocarbons, and hydrogen peroxide may be used in place of, or mixed with, water. Ammonium hydroxide and hydrogen peroxide may also be used. Water is preferred for the liquid in most applications. The advantages of using water include its low cost, small environmental impact, thermal capacity, and ability to dissolve many contaminants.

Ozone supplied by the ozone generator 72 may be delivered into the liquid supply line 258 or directly into the process chamber 166 at the ozone port 206. If the liquid 58 is heated by the heater 264, the solubility of ozone gas in the liquid will decrease. Consequently, some ozone delivered into the liquid supply line 258 may dissolve into the liquid, while excess ozone may form bubbles traveling with the liquid. Both the dissolved ozone and bubbles of ozone in the liquid, if any, can be helpful in the cleaning process.

Referring to FIGS. 8 and 12, the steam generator 112 (if used) provides steam to the steam nozzles 200 and/or 201. Preferably the nozzles spray steam directly onto or across the workpiece. The simultaneous introduction of steam to the workpiece surface during the high pressure liquid cleaning process adds additional striping and cleaning capability. The steam temperature can vary from 100°-500° C. Steam striking the workpiece surface can function to physically remove contaminants, like a high pressure liquid jet. In addition, as steam condenses on the workpiece surface, it releases about 2300 joules of energy per gram, due to the heat of condensation. This further heats the workpiece and speeds up processing.

Referring still to FIG. 8, the liquid jet 62 mechanically removes organic materials, metallic contaminants and other contaminants from the workpiece. The sonic transducers 202 and/or 203 (if used) increase the energy imparted to the workpiece. Providing sonic energy to the workpiece can cause greater impact energy when the liquid jet 62 strikes the workpiece. As the liquid jet 62 forms a substantially incompressible column of liquid, sonic energy from the transducers 202 at the nozzle 56 are imparted to the workpiece through the jet 62.

The electromagnetic radiation sources 204 and/or 205 (if used) are preferably aimed and focused on the surface of the workpiece being cleaned. The entire surface of the workpiece may be simultaneously irradiated. Alternatively, the source 204 may be aimed and focused at the point of impact of the jet 62 on the workpiece 20, via lenses or a fiberoptic delivery device. Combining different forms of energy (acoustic, electromagnetic, thermal and/or mechanical/hydraulic energy) to increase the removal effectiveness can be advantageous.

In the embodiment shown in FIG. 12, the swing arm assembly 190 pivots on the axle 212 through angle θ, e.g., 40°-70°, so that, with rotational movement of the workpiece 20, the jet 62 from the nozzle contacts substantially all surfaces on the (downwardly facing) workpiece surface. The motor 146 spins the workpiece 20 at from 1-5,000 rpm, depending on the contaminant that is being removed. For photoresist removal, preferred spin rates range from 100-2,000 rpm.

The chamber in each of the embodiments may operate at ambient pressure, or it may be pressurized to e.g., 1, 2, 3 or 4 atmospheres. Alternatively, for some specific applications, the chamber can be purged during processing, with un-entrained ozone (i.e., ozone that was never entrained with the liquid spray or jet) or with de-entrained ozone (i.e., ozone that has separated from or out of the liquid spray or jet) being purged from the chamber.

Thus, while several embodiments have been shown and described, various changes and substitutions may of course be made, without departing from the spirit and scope of the invention. The invention, therefore, should not be limited, except by the following claims, and their equivalents.

The invention claimed is:

1. A method for cleaning a workpiece comprising:
   heating a liquid to a temperature ranging from 50° C. to about 200° C.;
   placing the workpiece into a chamber;
   moving the liquid in a fluid flow line to the chamber;
   entraining ozone gas into the liquid by injecting ozone gas into the liquid while the liquid is in the fluid flow line;
   spraying the heated liquid onto the workpiece, with the heated liquid forming a liquid layer on the workpiece;
   providing ozone gas into the spray of heated liquid, with ozone carried with the heated liquid onto the workpiece, and with ozone chemically reacting with a contaminant on the workpiece, to clean the workpiece.

2. The method of claim 1 further comprising spinning the workpiece.

3. The method of claim 1 where the liquid comprises water and hydrochloric acid, sulfuric acid, ammonium hydroxide, or hydrogen peroxide.

4. The method of claim 1 with the liquid comprising water and HF.

5. The method of claim 1 further comprising drying the workpiece by applying alcohol onto the workpiece.

6. The method of claim 1 with the liquid comprising deionized water, and wherein the liquid, ozone and a carrier gas mixture is sprayed against the workpiece.

7. The method of claim 1 with ozone gas diffusing through the liquid layer.

8. The method of claim 1 further comprising providing ozone gas into the spray of heated liquid by forming an ozone gas environment within the chamber, and with the spray of heated liquid moving through the ozone gas environment.

9. A method for cleaning a workpiece, comprising:
   heating a liquid to 50-200° C.;
   entraining ozone gas into the heated liquid by mixing ozone gas with the heated liquid while the heated liquid is within a liquid reservoir;
   placing the workpiece into a chamber;
   moving the heated liquid from the liquid reservoir into the chamber;
   directing the heated liquid onto the workpiece, with the heated liquid forming a liquid layer on the workpiece;
   controlling a thickness of the liquid layer;
   confining ozone gas within the chamber to form an ozone gas environment around the workpiece; and
   cleaning the workpiece by chemical reaction of the ozone gas on the workpiece.

10. The method of claim 9 wherein the liquid is sprayed onto the workpiece.

11. The method of claim 9 further comprising spinning the workpiece.

12. The method of claim 9 where the liquid comprises water and a member selected from the group including one or more of hydrochloric acid, sulfuric acid, ammonium hydroxide, and hydrogen peroxide.

13. The method of claim 9 with the ozone injected into the liquid along with a carrier gas.

14. The method of claim 9 with the liquid comprising water and HF.

15. The method of claim 9 further comprising drying the workpiece by applying alcohol onto the workpiece.

16. The method of claim 9 with the liquid comprising deionized water, and wherein the liquid, ozone and a carrier gas mixture is sprayed against the workpiece.

17. The method of claim 9 further comprising spraying the heated liquid onto the workpiece through the ozone gas environment formed in the chamber, to entrain additional ozone gas into the liquid.

18. A method for cleaning at least one workpiece comprising:
   heating a process liquid to 50-200° C.;
   placing the workpiece into a chamber;
   moving the liquid in a fluid flow line to the chamber;
   entraining ozone gas into the liquid by injecting ozone gas into the liquid while the liquid is in the fluid flow line;
   applying the heated liquid onto the workpiece;
   forming the liquid into a liquid layer on the workpiece;
   controlling a thickness of the liquid layer on the workpiece;
   rotating the workpiece;
   and with the ozone chemically reacting with a contaminant on the workpiece, to clean the workpiece.

19. The method of claim 18 with the liquid including water and HF.

20. The method of claim 18 where the liquid comprises water and a member selected from hydrochloric acid, sulfuric acid, ammonium hydroxide, or hydrogen peroxide.

21. The method of claim 18 further comprising providing an ozone gas environment within the chamber and with additional ozone gas entrained in the liquid via the movement of the liquid through the ozone gas environment.

22. The method of claim 21 further comprising directing a spray of liquid out from a liquid spray nozzle in the chamber and by directing a flow of ozone gas out from a gas spray nozzle in the chamber into the spray of liquid.

23. The method of claim 21 wherein the ozone gas environment is formed in the chamber from ozone provided into the chamber with the liquid.

24. The method of claim 21 wherein the ozone gas environment is formed in the chamber by separately introducing ozone gas into the chamber as a dry gas.

* * * * *